US011920041B2

(12) United States Patent
Mori

(10) Patent No.: US 11,920,041 B2
(45) Date of Patent: Mar. 5, 2024

(54) COMPOSITION, FILM, INFRARED TRANSMITTING FILTER, AND SOLID-STATE IMAGING ELEMENT

(71) Applicant: FUJIFILM Corporation, Tokyo (JP)

(72) Inventor: Masahiro Mori, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 941 days.

(21) Appl. No.: 16/895,603

(22) Filed: Jun. 8, 2020

(65) Prior Publication Data

US 2020/0299512 A1 Sep. 24, 2020

Related U.S. Application Data

(63) Continuation of application No. PCT/JP2018/047133, filed on Dec. 21, 2018.

(30) Foreign Application Priority Data

Feb. 2, 2018 (JP) ................................ 2018-017197

(51) Int. Cl.

| | |
|---|---|
| ***C09B 47/30*** | (2006.01) |
| ***C09B 67/22*** | (2006.01) |
| ***C09D 17/00*** | (2006.01) |
| ***G02B 5/20*** | (2006.01) |
| ***G02B 5/22*** | (2006.01) |
| ***H01L 27/146*** | (2006.01) |

(52) U.S. Cl.

CPC .......... *C09B 67/0033* (2013.01); *C09B 47/30* (2013.01); *C09D 17/003* (2013.01); *G02B 5/208* (2013.01); *G02B 5/22* (2013.01); *H01L 27/1462* (2013.01)

(58) Field of Classification Search

CPC . C09B 47/30; C09B 67/0033; C09B 67/0041; G02B 5/208; G02B 5/22; G02B 5/201; C09D 17/003; C09D 201/00; H01L 27/1462; C09K 3/00; H04N 5/33

See application file for complete search history.

(56) References Cited

U.S. PATENT DOCUMENTS

2017/0012072 A1 1/2017 Tsuruta et al.

FOREIGN PATENT DOCUMENTS

| | | | |
|---|---|---|---|
| JP | 2014-228780 A | 12/2014 | |
| JP | 2018-177079 A | 10/2016 | |
| JP | 2018-177273 A | 10/2016 | |
| JP | 2016177273 A | * 10/2016 | ........... C08K 5/0041 |
| JP | 2017-133009 A | 8/2017 | |
| TW | 201700624 A | 1/2017 | |

(Continued)

OTHER PUBLICATIONS

Japanese Decision of Dismissal of Amendment for corresponding Japanese Application No. 2019-568936, dated Sep. 20, 2022, with English translation.

(Continued)

*Primary Examiner* — Derek S. Chapel

(74) *Attorney, Agent, or Firm* — Birch, Stewart Kolasch & Birch, LLP

(57) ABSTRACT

A composition includes: a metal-free phthalocyanine compound; a red colorant; and a solvent, in which a ratio A/B of an absorbance A at a wavelength of 700 nm to an absorbance B at a wavelength of 810 nm is 10 or higher.

15 Claims, 1 Drawing Sheet hν
112
116
115
114
111
110

(56) References Cited

FOREIGN PATENT DOCUMENTS

TW 201602649 A 1/2018

OTHER PUBLICATIONS

Japanese Decision of Refusal for corresponding Japanese Application No. 2019-568936, dated Sep. 20, 2022, with English translation.

International Preliminary Report on Patentability, dated Aug. 4, 2020 and Written Opinion of the International Searching Authority, with an English translation, dated Mar. 19, 2019 (forms PCT/IB/373, PCT/ISA/237 and PCT/IB/326), for International Application No. PCT/JP2018/047133.

International Search Report (form PCT/ISA/210), dated Mar. 19, 2019, for International Application No. PCT/JP2018/047133 with an English translation.

Office Action for Taiwanese Application No. 108100232, dated Jun. 8, 2022, including an English translation.

Japanese Office Action for Japanese Application No. 2019-568936, dated Apr. 5, 2022, with English translation.

Japanese Notice of Reasons for Refusal for Japanese Application No. 2019-568936, dated Sep. 7, 2021, with an English translation.

* cited by examiner

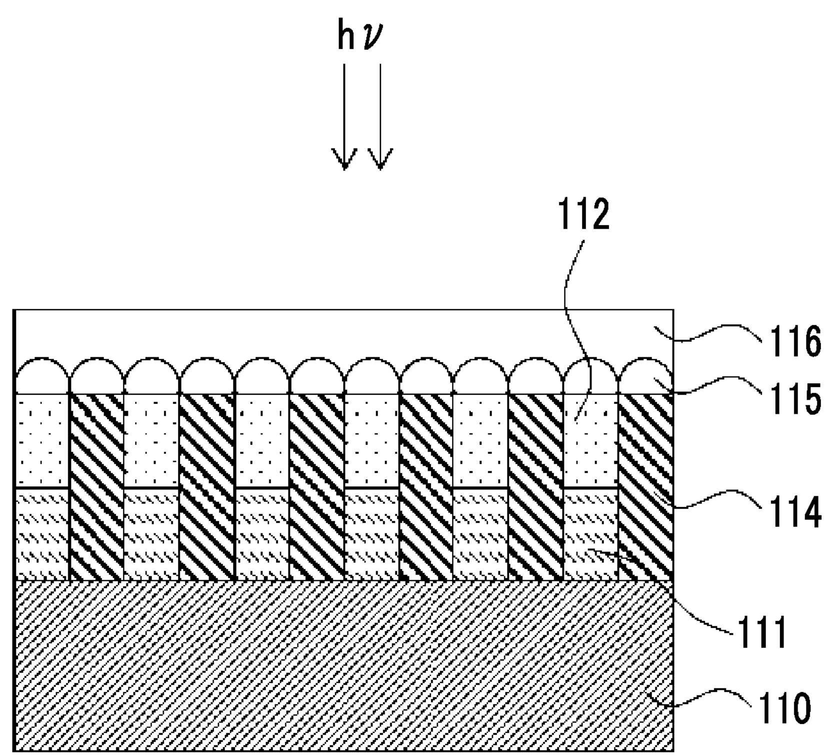
hν
112
116
115
114
111
110

COMPOSITION, FILM, INFRARED TRANSMITTING FILTER, AND SOLID-STATE IMAGING ELEMENT

CROSS-REFERENCE TO RELATED APPLICATIONS

This application is a Continuation of PCT International Application No. PCT/JP2018/047133 filed on Dec. 21, 2018, which claims priority under 35 U.S.C § 119(a) to Japanese Patent Application No. 2018-017197 filed on Feb. 2, 2018. Each of the above application(s) is hereby expressly incorporated by reference, in its entirety, into the present application.

BACKGROUND OF THE INVENTION

1. Field of the Invention

The present invention relates to a composition including a metal-free phthalocyanine compound. In addition, the present invention relates to a film formed of the above-described composition, an infrared transmitting filter, and a solid-state imaging element.

2. Description of the Related Art

A solid-state imaging element is used as an optical sensor in various applications. For example, infrared light is less likely to be scattered than visible light due to its longer wavelength and can be used in, for example, distance measurement or three-dimensional measurement. In addition, infrared light is invisible to humans or animals. Therefore, even in a case where a subject is irradiated with infrared light at night, the subject cannot recognize the infrared light. Thus, infrared light can be used for imaging a nocturnal wild animal or imaging a subject without provoking the subject for security reasons. This way, an optical sensor (infrared sensor) that detects infrared light can be used in various applications. In an infrared sensor, an infrared transmitting filter or the like is used. The infrared transmitting filter is manufactured using a composition including a coloring material (for example, refer to JP2016-177079A).

On the other hand, JP2014-228780A discloses a coloring composition for a black matrix in which pseudo black is obtained using a combination of two or more organic pigments selected from organic pigments of five colors including blue, violet, yellow, red, and orange, the organic pigments including at least one selected from the group consisting of C.I. Pigment Blue 16, C.I. Pigment Blue 79, C.I. Pigment Violet 29, C.I. Pigment Yellow 13, C.I. Pigment Yellow 174, C.I. Pigment Yellow 176, C.I. Pigment Yellow 185, and C.I. Pigment Yellow 213.

SUMMARY OF THE INVENTION

In a film that is formed using a composition including a coloring material, spectral characteristics may vary depending on light irradiation for a long period of time. In particular, an infrared transmitting filter includes a relatively large amount of a coloring material. Therefore, spectral characteristics are more likely to vary depending on light irradiation for a long period of time. On the other hand, in order to maintain various performance of a solid-state imaging element for a long period of time, further improvement of light fastness is desired for an infrared transmitting filter or the like.

In addition, the present inventors conducted an investigation on the films described in JP2016-177079A and JP2014-228780A and found that these films have insufficient light fastness and thus have a room for further improvement.

Accordingly, an object of the present invention is to provide a composition with which a film having excellent light fastness can be formed. In addition, another object of the present invention is to provide a film having excellent light fastness, an infrared transmitting filter, and a solid-state imaging element.

As a result of thorough investigation under the above-described circumstances, the present inventors found that the objects of the present invention can be achieved with a configuration described below, thereby completing the present invention. Accordingly, the present invention provides the following.

<1> A composition comprising:
a metal-free phthalocyanine compound;
a red colorant; and
a solvent,
in which a ratio A/B of an absorbance A at a wavelength of 700 nm to an absorbance B at a wavelength of 810 nm is 10 or higher.

<2> The composition according to <1>,
in which the metal-free phthalocyanine compound is a blue colorant.

<3> The composition according to <1> or <2>,
in which the metal-free phthalocyanine compound is Color Index Pigment Blue 16.

<4> The composition according to any one of <1> to <3>, further comprising at least one selected from a yellow colorant or a violet colorant.

<5> The composition according to any one of <1> to <4>,
in which a ratio C/D of a minimum value C of an absorbance of the composition in a wavelength range of 400 to 700 nm to a maximum value D of an absorbance of the composition in a wavelength range of 810 to 1100 nm is 4.5 or higher.

<6> The composition according to any one of <1> to <5>, further comprising a black colorat, in which the black colorant includes a bisbenzofuranone compound.

<7> The composition according to any one of <1> to <6>, which is a composition for an infrared transmitting filter.

<8> A film which is formed using the composition according to any one of <1> to <7>.

<9> An infrared transmitting filter comprising:
the film according to <8>.

<10> A solid-state imaging element comprising the infrared transmitting filter according to <9>.

<11> The solid-state imaging element according to <10>, further comprising a band pass filter that is provided on an optical path of the infrared transmitting filter and allows transmission of at least a part of infrared light transmitted through the infrared transmitting filter.

<12> The solid-state imaging element according to <11>,
in which the band pass filter is a filter that allows transmission of visible light and transmission of at least a part of infrared light transmitted through the infrared transmitting filter.

<13> The solid-state imaging element according to <11> or <12>,
in which in the band pass filter, a maximum value of a transmittance in a wavelength range of 730 to 780 nm is 10% or lower, and a minimum value of a transmittance in a wavelength range of 840 to 860 nm is 70% or higher.

<14> The solid-state imaging element according to any one of <11> to <13>, in which in a wavelength range of 700 to 850 nm, a wavelength λ1 at which a transmittance of the infrared transmitting filter is 50% is shorter than a shortest wavelength λ2 at which a transmittance of the band pass filter is 50%, and a difference between the wavelength λ2 and the wavelength λ1 is 30 nm or longer.

According to the present invention, a composition with which a film having excellent light fastness can be formed can be provided. In addition, a film having excellent light fastness, an infrared transmitting filter, and a solid-state imaging element can be provided.

BRIEF DESCRIPTION OF THE DRAWINGS

FIG. 1 is a diagram showing an embodiment of a solid-state imaging element according to the present invention.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC).

In this specification, the weight-average molecular weight (Mw) and the number-average molecular weight (Mn) can be obtained, for example, by using HLC-8220GPC (manufactured by Tosoh Corporation), using a column in which TOSOH TSK gel Super HZM-H, TOSOH TSK gel Super HZ4000, and TOSOH TSK gel Super HZ2000 are linked to each other, and using tetrahydrofuran as a developing solvent.

In this specification, in a chemical formula, Me represents a methyl group, Et represents an ethyl group, Bu represents a butyl group, and Ph represents a phenyl group.

In this specification, "infrared light" denotes light (electromagnetic wave) having a wavelength in a range of 700 to 2500 nm.

In this specification, "total solid content" denotes the total mass of all the components of the composition excluding a solvent.

In this specification, the term "step" denotes not only an individual step but also a step which is not clearly distinguishable from another step as long as an effect expected from the step can be achieved.

<Composition>

A composition according to an embodiment of the present invention comprises: a metal-free phthalocyanine compound; a red colorant; and a solvent, in which a ratio A/B of an absorbance A at a wavelength of 700 nm to an absorbance B at a wavelength of 810 nm is 10 or higher. With the composition according to the embodiment of the present invention, a film having excellent light fastness can be formed. The reason why this effect can be obtained is not clear but is presumed to be as follows. In the red colorant and the metal-free phthalocyanine, light energy transfer is likely to occur, and thus unnecessary light energy is scattered without being used for a reaction of decomposing a coloring material such that a film having excellent light fastness can be formed. In addition, in the composition, the ratio A/B of the absorbance A at a wavelength of 700 nm to the absorbance B at a wavelength of 810 nm is 10 or higher. Therefore, a film having excellent transmittance with respect to light having a wavelength of longer than 810 nm can also be formed.

In the composition according to the embodiment of the present invention, the ratio A/B of the absorbance A at a wavelength of 700 nm to the absorbance B at a wavelength of 810 nm is 10 or higher, preferably 15 or higher, more preferably 20 or higher, and still more preferably 25 or higher. The upper limit may be 100 or lower. In a case where the above-described absorbance ratio is 10 or higher, a film having excellent transmittance with respect to light having a wavelength of 810 nm can be formed.

In the composition according to the embodiment of the present invention, a ratio C/D of a minimum value C of an absorbance in a wavelength range of 400 to 700 nm to a maximum value D of an absorbance of the composition in a wavelength range of 810 to 1100 nm is 4.5 or higher, preferably 7.5 or higher, more preferably 15 or higher, and still more preferably 30 or higher. In a case where the above-described absorbance ratio is 4.5 or higher, a film having excellent light blocking properties with respect to light in a wavelength range of 400 to 700 nm and having excellent transmittance with respect to light in a wavelength range of longer than 810 nm can be formed.

An absorbance Aλ at a wavelength λ is defined by the following Expression (1).

$$A\lambda=-\log(T\lambda/100) \quad (1)$$

Aλ represents the absorbance at the wavelength λ, and Tλ represents a transmittance (%) at the wavelength λ.

In the present invention, a value of the absorbance may be a value measured in the form of a solution or a value of a film which is formed using the composition. In a case where the absorbance is measured in the form of the film, it is preferable that the absorbance is measured using a film that is formed by applying the composition to a glass substrate using a method such as spin coating such that the thickness of the dried film is a predetermined value, and drying the applied composition using a hot plate at 100° C. for 120 seconds.

In a case where a film having a thickness of 10.0 μm or less after drying (the thickness is preferably 5.0 μm or less, more preferably 3.0 μm or less, still more preferably 2.5 μm or less, more still more preferably 2.0 μm or less, and still more preferably 1.5 μm or less; In addition, the lower limit value may be 0.4 μm or more, 0.5 μm or more, 0.6 μm or more, 0.7 μm or more, 0.8 μm or more, or 0.9 μm or more) is formed with the composition according to the embodiment of the present invention, in the film having at least one of the above-described thicknesses, a transmittance with respect to light having a wavelength of 700 nm is preferably 20% or lower, more preferably 15% or lower, and still more preferably 10% or lower. In addition, in the film having at least one of the above-described thicknesses, a transmittance with respect to light having a wavelength of 810 nm is preferably 70% or higher, more preferably 75% or higher, and still more preferably 80% or higher. In the film having at least one of the above-described thicknesses, a maximum value of a transmittance with respect to light in a wavelength range of 400 to 700 nm is preferably 20% or lower, more preferably 15% or lower, and still more preferably 10% or lower. In addition, a minimum value of a transmittance with respect to light in a wavelength range of 810 to 1100 nm is preferably 70% or higher, more preferably 75% or higher, and still more preferably 80% or higher.

The composition according to the embodiment of the present invention can also be referred to as an infrared transmitting composition because it allows transmission of infrared light. Hereinafter, each of components which can form the composition according to the embodiment of the present invention will be described.

<<Metal-Free Phthalocyanine Compound>>

The composition according to the embodiment of the present invention includes the metal-free phthalocyanine compound. The metal-free phthalocyanine compound is a phthalocyanine compound not including central metal. The metal-free phthalocyanine compound used in the present invention may be a pigment or a dye. It is preferable that the metal-free phthalocyanine compound used in the present invention is a blue colorant. It is preferable that the metal-free phthalocyanine compound is a compound represented by the following Formula (Pc1).

(Pc1)

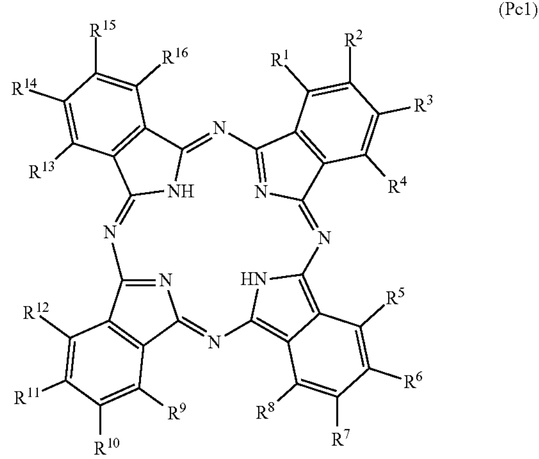

In the formula, $R^1$ to $R^{16}$ each independently represent a hydrogen atom or a substituent. Examples of the substituent include a substituent T described below. Among these, a halogen atom, an alkyl group, an alkoxy group, an aryloxy group, a heteroaryloxy group, an alkylthio group, an arylthio group, a heteroarylthio group, or an amino group.is preferable, a halogen atom or an alkylthio group is more preferable, and a halogen atom is still more preferable.

Examples of a preferable aspect of the metal-free phthalocyanine compound include the following (1) to (3). From the viewpoint that the effects of the present invention can be more significantly obtained, (1) is preferable. In addition, as the number of substituents decreases, a slope of absorption on a short wavelength side can be easily obtained, and there is an advantageous effect in formula design in that, for example, spectral characteristics of the composition can be easily adjusted.

(1) An aspect in which all of $R^1$ to $R^{16}$ represent a hydrogen atom.

(2) An aspect in which all of $R^1$ to $R^{16}$ represent a substituent.

(3) One to three of $R^1$ to $R^4$ represent a substituent, one to three of $R^5$ to $R^8$ represent a substituent, one to three of $R^9$ to $R^{12}$ represent a substituent, and one to three of $R^{13}$ to $R^{16}$ represent a substituent.

(Substituent T)

Examples of the above-described substituent T include the following groups: an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, an acyl group (preferably having an acyl group 1 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), a heteroaryloxycarbonyl group, an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably having 1 to 30 carbon atoms), an alkylsulfonyl group (preferably having 1 to 30 carbon atoms), an arylsulfonyl group (preferably having 6 to 30 carbon atoms), a heteroarylsulfonyl group (preferably having 1 to 30 carbon atoms), an alkylsulfinyl group (preferably having 1 to 30 carbon atoms), an arylsulfinyl group (preferably having 6 to 30 carbon atoms), a heteroarylsulfinyl group (preferably having 1 to 30 carbon atoms), a ureido group (preferably having 1 to 30 carbon atoms), a hydroxyl group, a carboxyl group, a sulfo group, a phosphate group, a carboxylic acid amide group, a sulfonic acid amide group, an imide acid group, a mercapto group, a halogen atom, a cyano group, an alkylsulfino group, an arylsulfino group, a hydrazino group, an imino group, and a heteroaryl group (preferably having 1 to 30 carbon atoms). In a case where the above-described groups can be further substituted, the groups may further have a substituent. Examples of the substituent which may be further included include the groups described regarding the substituent T.

Specific examples of the metal-free phthalocyanine compound include a compound having the following structure. From the viewpoint that the effects of the present invention can be significantly obtained, it is preferable that the metal-free phthalocyanine compound is Color Index Pigment Blue 16. In the following structural formulae, Me represents a methyl group, and Ph represents a phenyl group. In addition, PB16 represents Color Index Pigment Blue 16.

PB16

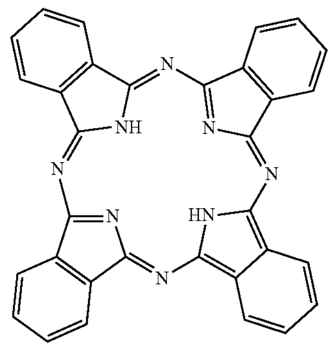

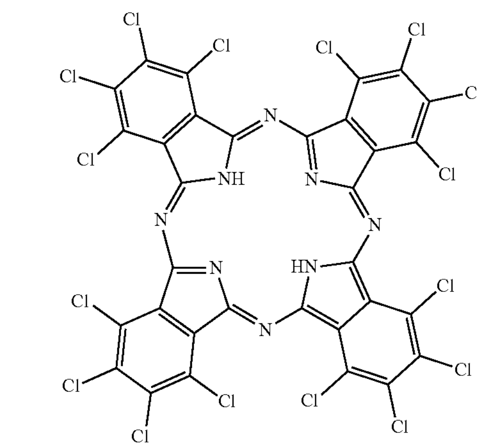

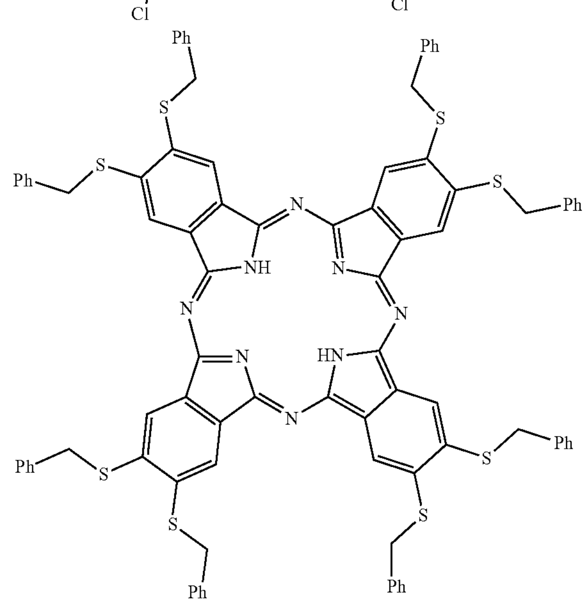

-continued

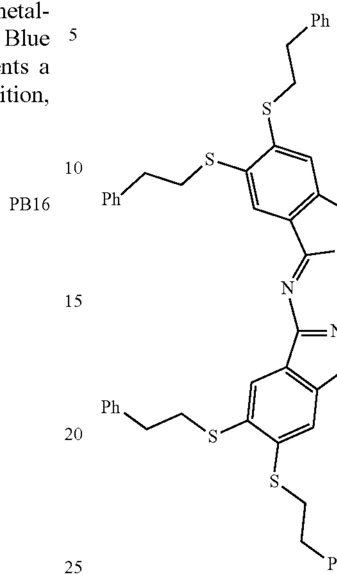

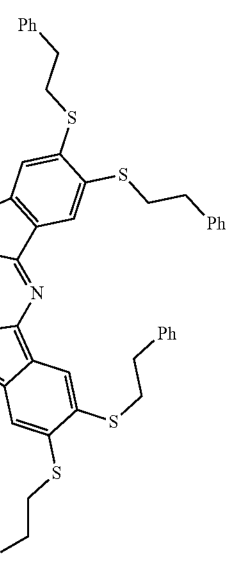

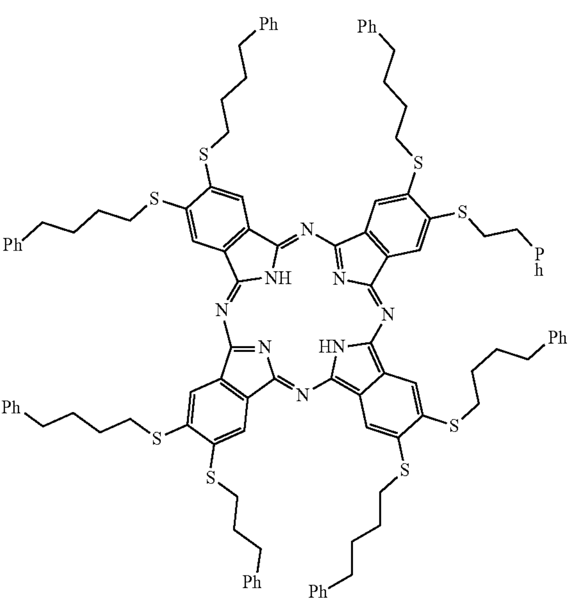

TABLE 1

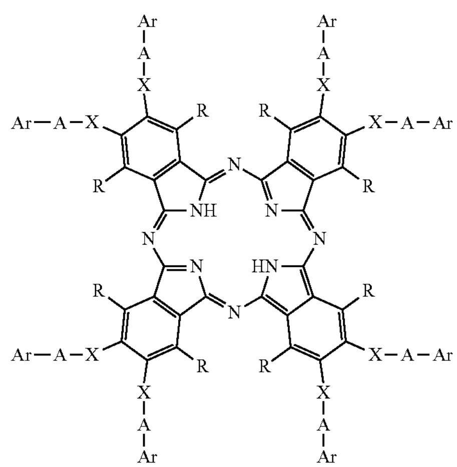

| 番号 | X | A | Ar | R |
|---|---|---|---|---|
| Pc-1 | O | —$CH_2$— | Ph | H |
| Pc-2 | O | —$CH_2$— | Ph | Cl |
| Pc-3 | O | —$(CH_2)_2$— | Ph | H |
| Pc-4 | O | —$(CH_2)_2$— | Ph | Br |
| Pc-5 | O | —$(CH_2)_2$— | Ph | Cl |
| Pc-6 | O | —$(CH_2)_2$— | $Ar^1$ | F |
| Pc-7 | O | —$(CH_2)_2$— | Ph | —OMe |
| Pc-8 | O | —$(CH_2)_2$— | $Ar^1$ | Cl |
| Pc-9 | O | —$(CH_2)_3$— | $Ar^2$ | Cl |
| Pc-10 | O | —$(CH_2)_2$— | $Ar^3$ | Cl |
| Pc-11 | O | —$(CH_2)_4$— | $Ar^2$ | F |
| Pc-12 | NH | —$CH_2$— | Ph | H |
| Pc-13 | NH | —$CH_2$— | Ph | Cl |
| Pc-14 | NH | —$(CH_2)_2$— | Ph | H |
| Pc-15 | NH | —$(CH_2)_2$— | Ph | Br |
| Pc-16 | NH | —$(CH_2)_2$— | Ph | Cl |
| Pc-17 | NH | —$(CH_2)_3$— | $Ar^1$ | F |
| Pc-18 | NH | —$(CH_2)_2$— | Ph | —OMe |
| Pc-19 | NH | —$(CH_2)_2$— | $Ar^1$ | Cl |
| Pc-20 | NH | —$(CH_2)_3$— | $Ar^2$ | Cl |
| Pc-21 | NH | —$(CH_2)_2$— | $Ar^3$ | Cl |
| Pc-22 | NH | —$(CH_2)_4$— | $Ar^2$ | Cl |
| Pc-23 | NMe | —$(CH_2)_2$— | Ph | H |
| Pc-24 | NMe | —$(CH_2)_2$— | Ph | Br |
| Pc-25 | NMe | —$(CH_2)_2$— | Ph | Cl |
| Pc-26 | NMe | —$(CH_2)_2$— | Ph | F |
| Pc-27 | NMe | —$(CH_2)_2$— | $Ar^1$ | Cl |
| Pc-28 | NMe | —$(CH_2)_2$— | $Ar^2$ | Cl |
| Pc-29 | NMe | —$(CH_2)_2$— | $Ar^3$ | Cl |
| Pc-30 | NPh | —$(CH_2)_2$— | Ph | H |
| Pc-31 | NPh | —$(CH_2)_2$— | Ph | Br |
| Pc-32 | NPh | —$(CH_2)_2$— | Ph | Cl |
| Pc-33 | NPh | —$(CH_2)_2$— | Ph | F |
| Pc-34 | S | —$CH_2$— | Ph | H |
| Pc-35 | S | —$CH_2$— | Ph | Cl |
| Pc-36 | S | —$(CH_2)_2$— | Ph | H |
| Pc-37 | S | —$(CH_2)_2$— | $Ar^1$ | H |
| Pc-38 | S | —$(CH_2)_2$— | $Ar^2$ | H |
| Pc-39 | S | —$(CH_2)_2$— | $Ar^3$ | Cl |
| Pc-40 | S | —$(CH_2)_2$— | Ph | Cl |
| Pc-41 | S | —$(CH_2)_2$— | Ph | Br |
| Pc-42 | S | —$(CH_2)_4$— | Ph | H |
| Pc-43 | S | —$(CH_2CH_2O)_2$— | Ph | H |
| Pc-44 | S | —$CH_2CH_2S_2$— | Ph | H |
| Pc-45 | S | —$CH_2CH_2NH$ — | Ph | H |

TABLE 1-continued

| 番号 | X | A | Ar | R |
|---|---|---|---|---|

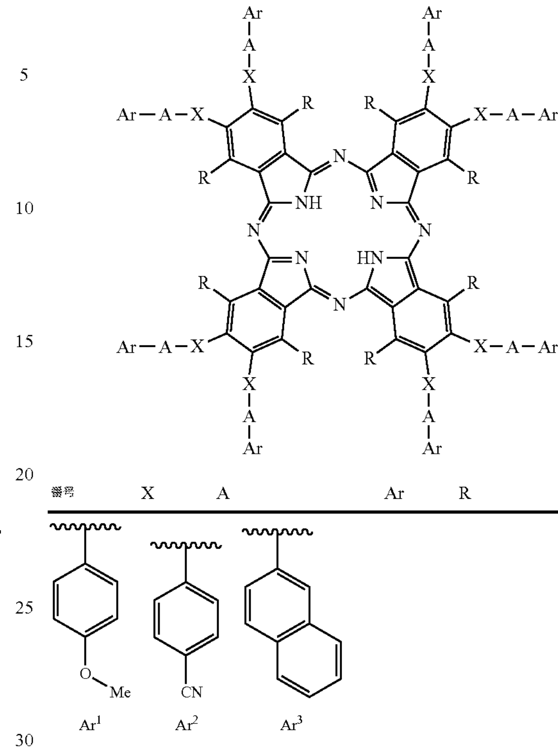

The content of the metal-free phthalocyanine compound is preferably 5% to 40 mass % with respect to the total solid content of the composition according to the embodiment of the present invention. The lower limit is preferably 10 mass % or higher and more preferably 15 mass % or higher. The upper limit is preferably 30 mass % or lower and more preferably 25 mass % or lower.

<<Red Colorant>>

The composition according to the present invention includes a red colorant. Examples of the red colorant include a diketo pyrrolo pyrrole compound, an anthraquinone compound, an azo compound, a quinacridone compound, and a perylene compound. From the viewpoint that higher light fastness can be easily obtained, a diketo pyrrolo pyrrole compound is preferable. Although the details are not specified, it is presumed that, since the diketo pyrrolo pyrrole compound has high crystallinity, energy transfer is more likely to occur. Therefore, by using the diketo pyrrolo pyrrole compound as the red colorant, higher light fastness can be obtained. The red colorant may be a pigment or a dye.

Examples of the red pigment include Color Index (C.I.) Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279. Among these, C.I. Pigment Red 254 or 264 is preferable.

In addition, as the red pigment, a compound having a structure in which an aromatic ring group into which a group having an oxygen atom, a sulfur atom, or a nitrogen atom bonded to an aromatic ring is introduced is bonded to a diketo pyrrolo pyrrole skeleton can also be used. This compound is preferably a compound represented by Formula (DPP1) and more preferably a compound represented by Formula (DPP2).

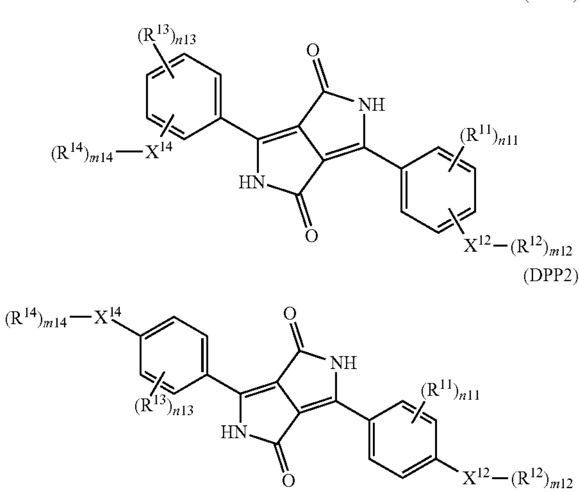

In the formula, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where represents an oxygen atom or a sulfur atom, m12 represents 1, in a case where $X^{12}$ represents a nitrogen atom, m12 represents 2, in a case where $X^{14}$ represents an oxygen atom or a sulfur atom, m14 represents 1, and in a case where $X^{14}$ represents a nitrogen atom, m14 represents 2. Examples of the substituent represented by $R^{11}$ and $R^{13}$ include the substituents described above regarding the substituent T. Specific preferable examples of the substituent represented by $R^{11}$ and $R^{13}$ include an alkyl group, an aryl group, a halogen atom, an acyl group, an alkoxycarbonyl group, an aryloxycarbonyl group, a heteroaryloxycarbonyl group, an amido group, a cyano group, a nitro group, a trifluoromethyl group, a sulfoxide group, and a sulfo group.

The content of the red colorant is preferably 5% to 40 mass % with respect to the total solid content of the composition according to the embodiment of the present invention. The lower limit is preferably 7 mass % or higher and more preferably 10 mass % or higher. The upper limit is preferably 35 mass % or lower, and more preferably 30 mass % or lower. In addition, the content of the red colorant is preferably 50 to 150 parts by mass with respect to 100 parts by mass of the metal-free phthalocyanine compound. The lower limit is preferably 60 parts by mass or more and more preferably 70 parts by mass or more. The upper limit is preferably 140 parts by mass or less and more preferably 130 parts by mass or less.

The total content of the metal-free phthalocyanine compound and the red colorant is preferably 20% to 70 mass % with respect to the total solid content of the composition according to the embodiment of the present invention. The lower limit is preferably 30 mass % or higher and more preferably 35 mass % or higher. The upper limit is preferably 65 mass % or lower, and more preferably 60 mass % or lower.

(Other Coloring Material)

The composition according to the embodiment of the present invention a coloring material other than the metal-free phthalocyanine compound and the red colorant. Examples of the other coloring material include a yellow colorant, a violet colorant, an orange colorant, a green colorant, and a black colorant. It is preferable that the composition according to the embodiment of the present invention includes at least one selected from a yellow colorant or a violet colorant as the other coloring material, and it is more preferable that the composition according to the embodiment of the present invention includes a yellow colorant and a violet colorant as the other coloring material. In this aspect, a composition having spectral characteristics in which a ratio C/D of a minimum value C of an absorbance of the composition in a wavelength range of 400 to 700 nm to a maximum value D of an absorbance of the composition in a wavelength range of 810 to 1100 nm is 4.5 or higher can be easily prepared. The other coloring material may be a pigment or a dye. As the pigment, an organic pigment is preferable. Preferable examples of the organic pigment are as follows:

C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Green 7, 10, 36, 37, 58, and 59 (all of which are green pigments); and C.I. Pigment Violet 1, 19, 23, 27, 32, 37, and 42 (all of which are violet pigments).

As the dye, well-known dyes can be used without any particular limitation. In addition, dyes described in JP2015-028144A and JP2015-034966A can also be used.

As the yellow colorant, C.I. Pigment Yellow 139, 150, 185 are preferable, C.I. Pigment Yellow 139 and 150 are more preferable, and C.I. Pigment Yellow 139 is still more preferable. As the violet colorant, C.I. Pigment Violet 23 is preferable.

Examples of the black colorant include a xanthene compound, a bisbenzofuranone compound, an azomethine compound, a perylene compound, and an azo compound.

Examples of the xanthene compound include a compound having the following structure. Examples of the bisbenzofuranone compound include compounds described in JP2010-534726A, JP2012-515233A, JP2012-515234A, WO2014/208348A, and JP2015-525260A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available.

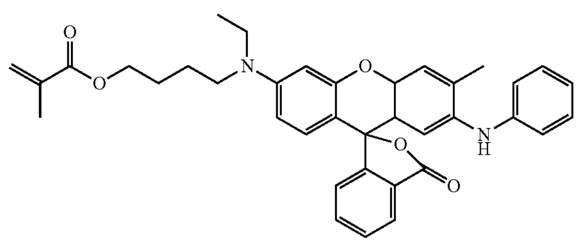 [SMILES: C=C(C)C(=O)OCCCCN(CC)c1ccc2c(c1)OC1C=C(C)C(Nc3ccccc3)=CC1C21OC(=O)c2ccccc21]

In the present invention, it is preferable that the bisbenzofuranone compound is one of the following compounds represented by the following formulae or a mixture thereof.

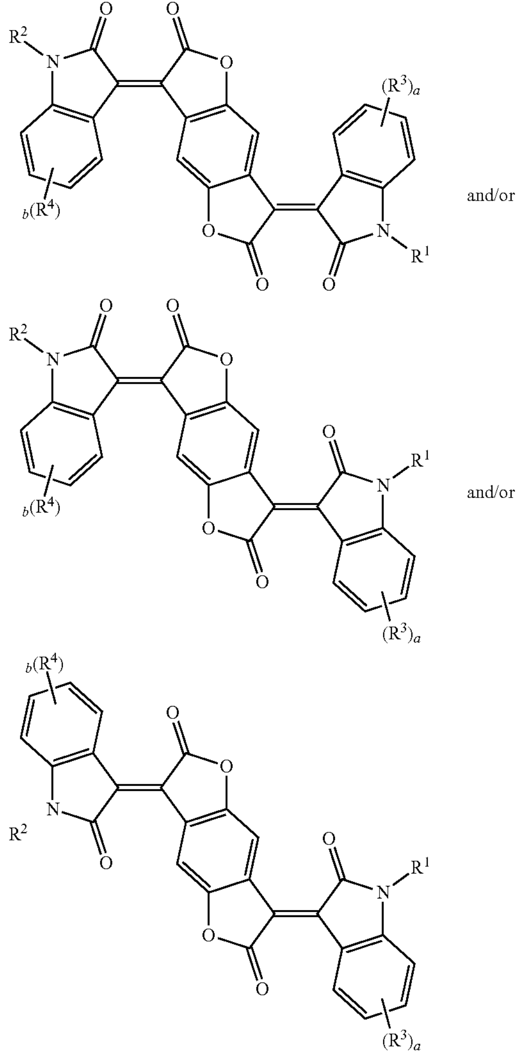

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring. Examples of the substituent represented by $R^1$ to $R^4$ include the above-described substituent T. The details of the bisbenzofuranone compound can be found in paragraphs "0014" to "0037" of JP2010-534726A, the content of which is incorporated herein by reference.

In the composition according to the embodiment of the present invention, as the other coloring material, a metal azo pigment including at least one anion selected from an azo compound represented by the following Formula (I) or an azo compound having a tautomeric structure of the azo compound represented by Formula (I), two or more metal ions, and a melamine compound can be used.

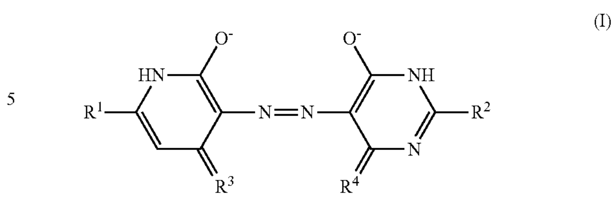

In the formula, $R^1$ and $R^2$ each independently represent OH or $NR^5R^6$, $R^3$ and $R^4$ each independently represent =O or $=NR^7$, and $R^5$ to $R^7$ each independently represent a hydrogen atom or an alkyl group. The number of carbon atoms in the alkyl group represented by $R^5$ to $R^7$ is preferably 1 to 10, more preferably 1 to 6, and still more preferably 1 to 4. The alkyl group may be linear, branched, or cyclic and is preferably linear or branched and more preferably linear. The alkyl group may have a substituent. Examples of the substituent include the above-described substituent T. In particular, a halogen atom, a hydroxy group, an alkoxy group, a cyano group, or an amino group is preferable.

In Formula (I), it is preferable that $R^1$ and $R^2$ represent OH. In addition, it is preferable that $R^3$ and $R^4$ represent O.

It is preferable that the melamine compound in the metal azo pigment is a compound represented by the following Formula (II).

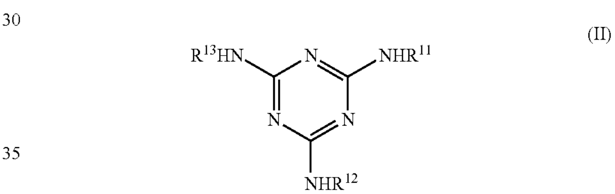

In the formula, $R^{11}$ to $R^{13}$ each independently represent a hydrogen atom or an alkyl group. The number of carbon atoms in the alkyl group is preferably 1 to 10, more preferably 1 to 6, and still more preferably 1 to 4. The alkyl group may be linear, branched, or cyclic and is preferably linear or branched and more preferably linear. The alkyl group may have a substituent. Examples of the substituent include the above-described substituent T. In particular, a hydroxy group is preferable. It is preferable that at least one of $R^{11}$ to $R^{13}$ represents a hydrogen atom, and it is more preferable that all of $R^{11}$ to $R^{13}$ represent a hydrogen atom.

In the metal azo pigment, the content of the melamine compound (preferably the compound represented by Formula (II)) is preferably 0.05 to 4 mol, more preferably 0.5 to 2.5 mol, and still more preferably 1.0 to 2.0 mol with respect to 1 mol of at least one anion selected from an azo compound represented by Formula (I) or an azo compound having a tautomeric structure of the azo compound represented by Formula (I).

In the metal azo pigment, it is preferable that at least one anion selected from an azo compound represented by Formula (I) or an azo compound having a tautomeric structure of the azo compound represented by Formula (I) and a metal ion form a metal complex. For example, in the case of a divalent metal ion Me, the anion and the metal ion Me form a metal complex having a structure represented by the following Formula (Ia). In addition, the metal ion Me may be bonded through a nitrogen atom in the tautomeric representation of Formula (Ia).

(Ia)

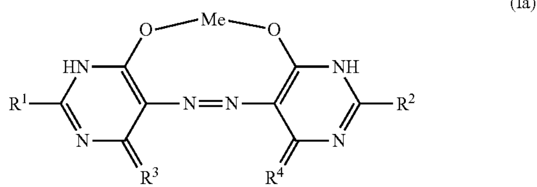

Examples of a preferable aspect of the metal azo pigment used in the present invention include metal azo pigments according to the following aspects (1) to (4). In particular, a metal azo pigment according to the aspect (1) is preferable.

(1) A metal azo pigment according to an aspect including at least one anion selected from an azo compound represented by Formula (I) or an azo compound having a tautomeric structure of the azo compound represented by Formula (I), metal ions including at least $Zn^{2+}$ and $Cu^{2+}$, and a melamine compound. In this aspect, the total content of $Zn^{2+}$ and $Cu^{2+}$ is preferably 95 to 100 mol %, more preferably 98 to 100 mol %, still more preferably 99.9 to 100 mol %, and still more preferably 100% with respect to 1 mol of all the metal ions of the metal azo pigment. In addition, a molar ratio $Zn^{2+}$:$Cu^{2+}$ of $Zn^{2+}$ to $Cu^{2+}$ in the metal azo pigment is preferably 199:1 to 1:15, more preferably 19:1 to 1:1, and still more preferably 9:1 to 2:1. In addition, in this aspect, the metal azo pigment may further include a divalent or trivalent metal ion (hereinafter, also referred to as "metal ion Me1") in addition to $Zn^{2+}$ and $Cu^{2+}$. Examples of the metal ion Me1 include $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, and $Ba^{2+}$. Among these, at least one selected from $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, or $Y^{3+}$ is preferable, at least one selected from $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable, and at least one selected from $Al^{3+}$, $Fe^{2+}$, $Fe^{3+}$, $Co^{2+}$, or $Co^{3+}$ is still more preferable. The content of the metal ion Me1 is preferably 5 mol % or lower, more preferably 2 mol % or lower, and still more preferably 0.1 mol % or lower with respect to 1 mol of all the metal ions of the metal azo pigment.

(2) A metal azo pigment according to an aspect including at least one anion selected from an azo compound represented by Formula (I) or an azo compound having a tautomeric structure of the azo compound represented by Formula (I), metal ions, and a melamine compound, in which the metal ions further includes $Ni^{2+}$, $Zn^{2+}$, and at least one metal ion Me2, and the metal ion Me2 is at least one selected from $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, $Yb^{3+}$, $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Cd^{2+}$, or $Pb^{2+}$. As the metal ion Me2, at least one selected from $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Mg^{2+}$, $Ca^{2+}$, $Sr^{2+}$, $Y^{3+}$, or $Mn^{2+}$ is preferable, and at least one selected from $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable. In this aspect, it is preferable that the total content of $Zn^{2+}$ and $Ni^{2+}$ is 75 to 99.5 mol % and the content of the metal ion Me2 is 0.5 to 25 mol % with respect to 1 mol of all the metal ions of the metal azo pigment, it is more preferable that the total content of $Zn^{2+}$ and $Ni^{2+}$ is 78 to 95 mol % and the content of the metal ion Me2 is 5 to 22 mol % with respect to 1 mol of all the metal ions of the metal azo pigment, and it is still preferable that the total content of $Zn^{2+}$ and $Ni^{2+}$ is 82 to 90 mol % and the content of the metal ion Me2 is 10 to 18 mol % with respect to 1 mol of all the metal ions of the metal azo pigment. In addition, a molar ratio $Zn^{2+}$:$Ni^{2+}$ of $Zn^{2+}$ to $Ni^{2+}$ in the metal azo pigment is preferably 90:3 to 3:90, more preferably 80:5 to 5:80, and still more preferably 60:33 to 33:60.

(3) A metal azo pigment according to an aspect including at least one anion selected from an azo compound represented by Formula (I) or an azo compound having a tautomeric structure of the azo compound represented by Formula (I), metal ions, and a melamine compound, in which the metal ions further includes $Ni^{2+}$, $Cu^{2+}$, and at least one metal ion Me3, and the metal ion Me3 is at least one selected from $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, or $Ba^{2+}$. As the metal ion Me3, at least one selected from $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, or $Y^{3+}$ is preferable, and at least one selected from $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable. In this aspect, it is preferable that the total content of $Cu^{2+}$ and $Ni^{2+}$ is 70 to 99.5 mol % and the content of the metal ion Me3 is 0.5 to 30 mol % with respect to 1 mol of all the metal ions of the metal azo pigment, it is more preferable that the total content of $Cu^{2+}$ and $Ni^{2+}$ is 75 to 95 mol % and the content of the metal ion Me3 is 5 to 25 mol % with respect to 1 mol of all the metal ions of the metal azo pigment, and it is still more preferable that the total content of $Cu^{2+}$ and is 80 to 90 mol % and the content of the metal ion Me3 is 10 to 20 mol % with respect to 1 mol of all the metal ions of the metal azo pigment. In addition, a molar ratio $Cu^{2+}$:$Ni^{2+}$ of $Cu^{2+}$ to $Ni^{2+}$ in the metal azo pigment is preferably 42:1 to 1:42, more preferably 10:1 to 1:10, and still more preferably 3:1 to 1:3.

(4) A metal azo pigment according to an aspect including at least one anion selected from an azo compound represented by Formula (I) or an azo compound having a tautomeric structure of the azo compound represented by Formula (I), metal ions, and a melamine compound, in which the metal ions include $Ni^{2+}$ and a metal ion Me4a, and the metal ion Me4a is at least one selected from $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$ or $Yb^{3+}$. As the metal ion Me4a, at least one selected from $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, or $Yb^{3+}$ is preferable, and at least one selected from $La^{3+}$, $Ce^{3+}$, $Pr^{3+}$, $Nd^{3+}$, $Sm^{3+}$, $Tb^{3+}$, or $Ho^{3+}$ is more preferable. In this aspect, the total content of Ni' and the metal ion Me4a is preferably 95 to 100 mol %, more preferably 98 to 100 mol %, still more preferably 99.9 to 100 mol %, and still more preferably 100% with respect to 1 mol of all the metal ions of the metal azo pigment. In addition, a molar ratio $Ni^{2+}$:Metal ion Me4a of $Ni^{2+}$ to the metal ion Me4a in the metal azo pigment is preferably 1:1 to 19:1, more preferably 2:1 to 4:1, and still more preferably 2.3:1 to 3:1. In addition, in this aspect, the metal azo pigment may further include a metal ion (hereinafter, also referred to as "metal ion Me4b") in addition to $Ni^{2+}$ and the metal ion Me4a. Examples of the metal ion Me4b include $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Fe^{2+}$, $Fe^{3+}$, $Co^{2+}$, $Co^{3+}$, $Cu^{2+}$, $Zn^{2+}$, $Cd^{2+}$, $Al^{3+}$, and $Pb^{2+}$. Among these, at least one selected from $Mg^{2+}$, $Ca^{2+}$, $Sr^{2+}$, $Y^{3+}$, $Mn^{2+}$, $Fe^{2+}$, $Fe^{3+}$, $Co^{2+}$, $Co^{3+}$, $Cu^{2+}$, $Zn^{2+}$, or $Al^{3+}$ is preferable, and at least one selected from $Sr^{2+}$, $Fe^{2+}$, $Fe^{3+}$, $Co^{2+}$, $Co^{3+}$, $Cu^{2+}$, $Zn^{2+}$, or $Al^{3+}$ is more preferable. In addition, the content of the metal ion Me4b is preferably 5 mol % or lower, more preferably 2 mol % or lower, and still more preferably 0.1 mol % or lower with respect to 1 mol of all the metal ions of the metal azo pigment.

In the metal azo pigment, it is preferable that a metal azo compound composed of at least one anion selected from an azo compound represented by Formula (I) or an azo compound having a tautomeric structure of the azo compound represented by Formula (I) and metal ions and a melamine compound (preferably the compound represented by Formula (II)) form an adduct. It can be understood that the adduct is a molecular aggregate. For example, an intermolecular bond may be formed by an intermolecular interaction, by a Lewis acid-base interaction, or by a coordinate bond or a chain conjugation. In addition, the adduct may have a structure such as a clathrate compound in which a guest molecule is incorporated into a lattice of host molecules. In addition, the adduct may have a structure such as mixed intercalation crystals (including an interstitial compound). The mixed intercalation crystals refer to chemical non-stoichiometric crystalline compounds consisting of at least two elements. In addition, the adduct may be mixed substitution crystals in which two materials form a common crystal and atoms of a second component are positioned at positions of a regular lattice of a first component.

The metal azo pigment may be a physical mixture or a chemical mixed compound. It is preferable that the metal azo pigment is a physical mixture.

The details of the metal azo pigment can be found in paragraphs "0011" to "0062" and "0137" to "0276" of JP2017-171912A, paragraphs "0010" to "0062" and "0138" to "0295" of JP2017-171913A, paragraphs "0011" to "0062" and "0139" to "0190" of JP2017-171914A, and paragraphs "0010" to "0065" and "0142" to "0222" of JP2017-171915A, the contents of which are incorporated herein by reference.

The content of the other coloring material is preferably 30 mass % or lower with respect to the total solid content of the composition according to the embodiment of the present invention. The lower limit is preferably 1 mass % or higher and more preferably 3 mass % or higher.

The content of the yellow colorant is preferably 30 mass % or lower with respect to the total solid content of the composition according to the embodiment of the present invention. The lower limit is preferably 1 mass % or higher and more preferably 3 mass % or higher.

The content of the violet colorant is preferably 30 mass % or lower with respect to the total solid content of the composition according to the embodiment of the present invention. The lower limit is preferably 1 mass % or higher and more preferably 3 mass % or higher.

The total content of the yellow colorant and the violet colorant is preferably 30 mass % or lower with respect to the total solid content of the composition according to the embodiment of the present invention. The lower limit is preferably 1 mass % or higher and more preferably 3 mass % or higher.

<<Solvent>>

The composition according to the embodiment of the present invention includes a solvent. Examples of the solvent include an organic solvent. Basically, the solvent is not particularly limited as long as it satisfies the solubility of the respective components and the application properties of the composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In addition, 3-methoxy-N,N-dimethylpropanamide or 3-butoxy-N,N-dimethylpropanamide is also preferable from the viewpoint of improving solubility. In addition, due to the reasons of an environmental aspect, it may be preferable to reduce the content of an aromatic hydrocarbon (for example, benzene, toluene, xylene, or ethylbenzene) as a solvent. For example, the content may be 50 mass parts per million (ppm) or lower, 10 mass ppm or lower, or 1 mass ppm or lower with respect to the total mass of the organic solvent.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 5% to 50 mass % with respect to the concentration of solid contents (total solid content) of the composition. The upper limit is preferably 45 mass % or lower and more preferably 40 mass % or lower. The lower limit is 8 mass % or higher and more preferably 10 mass % or higher.

In addition, it is preferable that the composition according to the embodiment of the present invention does not substantially include an environmentally regulated material. In the present invention, the composition not substantially including the environmentally regulated material represents that the content of the environmentally regulated material in the composition is 50 mass ppm or lower, preferably 30 mass ppm or lower, more preferably 10 mass ppm or lower, and still more preferably 1 mass ppm or lower. Examples of the environmentally regulated material include: benzene; an alkylbenzene such as toluene or xylene; and a halogenated benzene such as chlorobenzene. These compounds are registered as environmentally regulated materials based on Registration Evaluation Authorization and Restriction of Chemicals (REACH) regulation, Pollutant Release and Transfer Register (PRTR) method, Volatile Organic Compound (VOC) regulation, and the like, and the amount thereof used and a handling method thereof are strictly regulated. These compounds are used as solvents in a case where each of the components or the like used in the composition according to the embodiment of the present invention, and may be incorporated into the composition as residual solvents. From the viewpoints of safety for humans and consideration of the environment, it is preferable that these materials are reduced as much as possible. Examples of a method of reducing the environmentally regulated material include a method of distilling off the environmentally regulated material from the system by heating or depressurizing the system such that the temperature of the system is higher than or equal to a boiling point of the environmentally regulated material. In addition, in a case where a small amount of environmentally regulated material is removed by distillation, a method of azeotroping the environmentally regulated material with a solvent having the same boiling point as that of the corresponding solvent is also useful to increase the efficiency. In addition, in a case where a radically polymerizable compound is included, in order to suppress intermolecular crosslinking caused by the progress of a radical polymerization reaction during distillation under reduced pressure, a polymerization inhibitor or the like may be added for distillation under reduced pressure. This distillation method can be performed in, for example, any of a step of raw materials, a step of a reaction product (for example, a resin solution or a polyfunctional monomer solution after polymerization) obtained from a reaction of the raw materials, or a step of a composition prepared by mixing these compounds with each other.

<<Curable Compound>>

It is preferable that the composition according to the embodiment of the present invention includes a curable compound. As the curable compound, a well-known compound which is crosslinkable by a radical, an acid, or heat can be used. Examples of the crosslinking compound include a compound which has a group having an ethylenically unsaturated bond and a compound having a cyclic ether group. Examples of the group having an ethylenically unsaturated bond include a vinyl group, a (meth)allyl group, and a (meth)acryloyl group. Examples of the cyclic ether group include an epoxy group and an oxetanyl group. In the present invention, as the curable compound, a radically polymerizable compound or a cationically polymerizable compound is preferable, and a radically polymerizable compound is more preferable.

The content of the curable compound is preferably 0.1 to 40 mass % with respect to the total solid content of the composition according to the embodiment of the present invention. For example, the lower limit is more preferably 0.5 mass % or higher and still more preferably 1 mass % or higher. For example, the upper limit is more preferably 30 mass % or lower and still more preferably 20 mass % or lower. As the curable compound, one kind may be used alone, or two or more kinds may be used in combination. In a case where the two or more curable compounds are used in combination, it is preferable that the total content of the two or more curable compounds is in the above-described range.

(Radically Polymerizable Compound)

The radically polymerizable compound is not particularly limited as long as it is a compound that is polymerizable by the action of a radical. As the radically polymerizable compound, a compound having one or more groups having an ethylenically unsaturated bond is preferable, a compound having two or more groups having an ethylenically unsaturated bond is more preferable, and a compound having three or more groups having an ethylenically unsaturated bond is still more preferable. The upper limit of the number of the groups having an ethylenically unsaturated bond is, for example, preferably 15 or less and more preferably 6 or less. Examples of the group having an ethylenically unsaturated bond include a vinyl group, a (meth)allyl group, and a (meth)acryloyl group. Among these, a (meth)acryloyl group is preferable. The radically polymerizable compound is preferably a (meth)acrylate compound having 3 to 15 functional groups and more preferably a (meth)acrylate compound having 3 to 6 functional groups.

The radically polymerizable compound may be in the form of a monomer or a polymer and is preferably a monomer. The molecular weight of the monomer type radically polymerizable compound is preferably 200 to 3000. The upper limit of the molecular weight is preferably 2500 or lower and more preferably 2000 or lower. The lower limit of the molecular weight is preferably 250 or higher and more preferably 300 or higher.

Examples of the radically polymerizable compound include dipentaerythritol triacrylate (KAYARAD D-330 as a commercially available product; manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta (meth)acrylate (KAYARAD D-310 as a commercially available product; manufactured by Nippon Kayaku Co., Ltd.), dipentaerythritol hexa(meth)acrylate (as a commercially available product, KAYARAD DPHA manufactured by Nippon Kayaku Co., Ltd.; NK ESTER A-DPH-12E manufactured by Shin-Nakamura Chemical Co., Ltd.), a compound having a structure in which the (meth)acryloyl group is bonded through an ethylene glycol or a propylene glycol residue (for example, SR454 and SR499 available from Sartomer), NK ESTER A-TMMT (manufactured by Shin-Nakamura Chemical Co., Ltd.), and KAYARAD RP-1040 and DPCA-20 (manufactured by Nippon Kayaku Co., Ltd.). In addition, as the radically polymerizable compound, a trifunctional (meth)acrylate compound such as trimethylolpropane tri(meth)acrylate, trimethylolpropane propyleneoxy-modified tri(meth)acrylate, trimethylolpropane ethyleneoxy-modified tri(meth)acrylate, isocyanuric acid ethyleneoxy-modified (meth)acrylate, or pentaerythritol tri(meth)acrylate is also preferably used. Examples of a commercially available product of the trifunctional (meth) acrylate compound include ARONIX M-309, M-310, M-321, M-350, M-360, M-313, M-315, M-306, M-305, M-303, M-452, and M-450 (all of which are manufactured by Toagosei Co., Ltd.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), KAYARAD GPO-303, TMPTA, THE-330, TPA-330, and PET-30 (manufactured by Nippon Kayaku Co., Ltd.), and TMPEOTA (manufactured by Daicel-Allnex Ltd.).

As the radically polymerizable compound, a compound having an acid group such as a carboxyl group, a sulfo group, or a phosphate group can also be used. Examples of a commercially available product of the radically polymerizable compound having an acid group include ARONIX M-305, M-510, and M-520 (manufactured by Toagosei Co., Ltd.). The acid value of the radically polymerizable compound having an acid group is preferably 0.1 to 40 mgKOH/g. The lower limit is preferably 5 mgKOH/g or higher. The upper limit is preferably 30 mgKOH/g or lower.

In addition, it is also preferable that the radically polymerizable compound is a compound having a caprolactone structure. The radically polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the radically polymerizable compound having a caprolactone structure can be found in paragraphs "0042" to "0045" of JP2013-253224A, the content of which is incorporated herein by reference. As the compound having a caprolactone structure, for example, KAYARAD DPCA series (manufactured by Nippon Kayaku Co., Ltd.) is commercially available, and examples thereof include DPCA-20, DPCA-30, DPCA-60, and DPCA-120.

As the radically polymerizable compound, a compound which has a group having an ethylenically unsaturated bond and an alkyleneoxy group can also be used. As the compound which has a group having an ethylenically unsaturated bond and an alkyleneoxy group, a compound which has a group having an ethylenically unsaturated bond, an ethyleneoxy group, and/or a propyleneoxy group is preferable, a compound which has a group having an ethylenically unsaturated bond and an ethyleneoxy group is more preferable, and a trifunctional to hexafunctional (meth)acrylate compound having 4 to 20 ethyleneoxy groups is still more preferable. Examples of a commercially available product of the compound which has a group having an ethylenically unsaturated bond and an alkyleneoxy group include SR-494 (manufactured by Sartomer) which is a tetrafunctional (meth)acrylate having four ethyleneoxy groups, and KAYARAD TPA-330 which is a trifunctional (meth)acrylate having three isobutyleneoxy groups.

As the radically polymerizable compound, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) can be used. Examples of a commercially available product of the polymerizable compound include UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600 and AI-600 (manufactured by Kyoeisha Chemical Co., Ltd.).

In addition, as the radically polymerizable compound, a compound described in JP2017-048367A, JP6057891B, or JP6031807B, a compound described in JP2017-194662A, 8UH-1006 or 8UH-1012 (manufactured by Taisei Fine Chemical Co., Ltd.), or LIGHT ACRYLATE POB-A0 (manufactured by Kyoeisha Chemical Co., Ltd.) is preferably used.

In a case where the composition according to the embodiment of the present invention includes the radically polymerizable compound, the content of the radically polymerizable compound is preferably 0.1 to 40 mass % with respect to the total solid content of the composition according to the embodiment of the present invention. For example, the lower limit is more preferably 0.5 mass % or higher and still more preferably 1 mass % or higher. For example, the upper limit is more preferably 30 mass % or lower and still more preferably 20 mass % or lower. As the radically polymerizable compound, one kind may be used alone, or two or more kinds may be used in combination. In a case where two or more radically polymerizable compounds are used in combination, it is preferable that the total content of the two or more radically polymerizable compounds is in the above-described range.

(Cationically Polymerizable Compound)

Examples of the cationically polymerizable compound include a compound having a cationically polymerizable group. Examples of the cationically polymerizable group include a cyclic ether group such as an epoxy group or an oxetanyl group and an unsaturated carbon double bond group such as a vinyl ether group or an isobutene group. As the cationically polymerizable compound, a compound having a cyclic ether group is preferable, and a compound having an epoxy group is more preferable.

Examples of the compound having an epoxy group include a compound having one or more epoxy groups in one molecule. In particular, a compound having two or more epoxy groups in one molecule is preferable. The number of epoxy groups in one molecule is preferably 1 to 100. The upper limit of the number of epoxy groups is, for example, 10 or less or 5 or less. The lower limit of the number of epoxy groups is preferably 2 or more.

The compound having an epoxy group may be a low molecular weight compound (for example, molecular weight: lower than 2000 or lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and still more preferably 3000 or lower.

In a case where the compound having an epoxy group is a low molecular weight compound, the compound having an epoxy group is, for example, a compound represented by the following Formula (EP1).

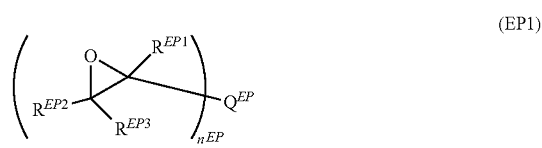

(EP1)

In Formula (EP1), $R^{EP1}$ to $R^{EP3}$ each independently represent a hydrogen atom, a halogen atom, or an alkyl group. The alkyl group may have a cyclic structure or may have a substituent. In addition, $R^{EP1}$ and $R^{EP2}$, or $R^{EP2}$ and $R^{EP3}$ may be bonded to each other to form a ring structure. $Q^{EP}$ represents a single bond or a $n^{EP}$-valent organic group. $R^{EP1}$ to $R^{EP3}$ may be bonded to $Q^{EP}$ to form a ring structure. $n^{EP}$ represents an integer of 2 or more, preferably 2 to 10, and more preferably 2 to 6. In a case where $Q^{EP}$ represents a single bond, $n^{EP}$ represents 2.

The details of $R^{EP1}$ to $R^{EP3}$ and $Q^{EP}$ can be found in paragraphs "0087" and "0088" of JP2014-089408A, the content of which is incorporated herein by reference. Specific examples of the compound represented by Formula (EP1) include a compound described in paragraph "0090" of JP2014-089408A and a compound described in paragraph "0151" of JP2010-054632A, the content of which is incorporated herein by reference.

Examples of a commercially available product of the low molecular weight compound include ADEKA GLYCILOL series manufactured by Adeka Corporation (for example, ADEKA GLYCILOL ED-505) and EPOLEAD series manufactured by Daicel Corporation (for example, EPOLEAD GT401).

As the compound having an epoxy group, an epoxy resin can be preferably used. Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound. The epoxy equivalent of the epoxy resin is preferably 310 to 3300 g/eq, more preferably 310 to 1700 g/eq, and still more preferably 310 to 1000 g/eq.

Examples of a commercially available product of the epoxy resin include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer).

In the present invention, as the compound having an epoxy group, a compound described in paragraphs "0034" to "0036" of JP2013-011869A, paragraphs "0147" to "0156" of JP2014-043556A, or paragraphs "0085" to "0092" of JP2014-089408A or a compound described in JP2017-179172A can also be used. The contents of this specification are incorporated herein by reference.

In a case where the composition according to the embodiment of the present invention includes the cationically polymerizable compound, the content of the cationically polymerizable compound is preferably 0.1 to 40 mass % with respect to the total solid content of the composition according to the embodiment of the present invention. For example, the lower limit is more preferably 0.5 mass % or higher and still more preferably 1 mass % or higher. For example, the upper limit is more preferably 30 mass % or lower and still more preferably 20 mass % or lower. As the cationically polymerizable compound, one kind may be used alone, or two or more kinds may be used in combination. In a case where two or more cationically polymerizable compounds are used in combination, it is preferable that the total content of the two or more cationically polymerizable compounds is in the above-described range.

In addition, in a case where the composition according to the embodiment of the present invention includes the radically polymerizable compound and the cationically polymerizable compound, a mass ratio radically polymerizable compound:cationically polymerizable compound is preferably 100:1 to 100:400 and more preferably 100:1 to 100:100.

<<Photopolymerization Initiator>>

The composition according to the embodiment of the present invention may include a photopolymerization initiator. Examples of the photopolymerization initiator include a photoradical polymerization initiator and a photocationic polymerization initiator. It is preferable that the photoinitiator is selected and used according to the kind of the curable compound. In a case where the radically polymerizable compound is used as the curable compound, it is preferable that the photoradical polymerization initiator is used as the photopolymerization initiator. In a case where the cationically polymerizable compound is used as the curable compound, it is preferable that the photocationic polymerization initiator is used as the photopolymerization initiator. The photopolymerization initiator is not particularly limited and can be appropriately selected from well-known photopolymerization initiators. For example, a compound having photosensitivity to light in a range from an ultraviolet range to a visible range is preferable.

The content of the photopolymerization initiator is preferably 0.1 to 50 mass %, more preferably 0.5 to 30 mass %, and still more preferably 1 to 20 mass % with respect to the total solid content of the composition according to the embodiment of the present invention. In a case where the content of the photopolymerization initiator is in the above-described range, higher sensitivity and pattern formability can be obtained. The composition according to the embodiment of the present invention may include one photopolymerization initiator or two or more photopolymerization initiators. In a case where the composition includes two or more photopolymerization initiators, it is preferable that the total content of the two or more photopolymerization initiators is in the above-described range.

(Photoradical Polymerization Initiator)

Examples of the photoradical polymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, or an acylphosphine compound is more preferable, and an oxime compound is still more preferable. The details of the photoradical polymerization initiator can be found in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

Examples of the oxime compound include a compound described in JP2001-233842A, a compound described in JP2000-080068A, a compound described in JP2006-342166A, a compound described in J. C. S. Perkin II (1979, pp. 1653 to 1660), a compound described in J. C. S. Perkin II (1979, pp. 156 to 162), a compound described in Journal of Photopolymer Science and Technology (1995, pp. 202 to 232), a compound described in JP2000-066385A, a compound described in JP2000-080068A, a compound described in JP2004-534797A, a compound described in JP2006-342166A, a compound described in JP2017-019766A, a compound described in JP6065596B, a compound described in WO2015/152153A, and a compound described in WO2017/051680A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product of the oxime compound include IRGACURE-OXE01, IRGACURE-OXE02, IRGACURE-OXE03, or IRGACURE-OXE04 (all of which are manufactured by BASF SE), TR-PBG-304 (manufactured by Changzhou Tronly New Electronic Materials Co., Ltd.), and ADEKA OPTOMER N-1919 (manufactured by Adeka Corporation, a photopolymerization initiator 2 described in JP2012-014052A). As the oxime compound, a compound having no colorability or a compound having high transparency that is not likely to be discolored can also be preferably used. Examples of a commercially available product of the oxime compound include ADEKA ARKLS NCI-730, NCI-831, and NCI-930 (all of which are manufactured by Adeka Corporation).

In the present invention, an oxime compound having a fluorene ring can also be used as the photopolymerization initiator. Specific examples of the oxime compound having a fluorene ring include a compound described in JP2014-137466A. The content of this specification is incorporated herein by reference.

In the present invention, an oxime compound having a fluorine atom can also be used as the photoradical polymerization initiator. Specific examples of the oxime compound having a fluorine atom include a compound described in JP2010-262028A, Compound 24 and 36 to 40 described in JP2014-500852A, and Compound (C-3) described in JP2013-164471A. The content of this specification is incorporated herein by reference.

In the present invention, as the photoradical polymerization initiator, an oxime compound having a nitro group can be used. It is preferable that the oxime compound having a nitro group is a dimer. Specific examples of the oxime compound having a nitro group include a compound described in paragraphs “0031” to “0047” of JP2013-114249A and paragraphs “0008” to “0012” and “0070” to “0079” of JP2014-137466A, a compound described in paragraphs “0007” to 0025” of JP4223071B, and ADEKA ARKLS NCI-831 (manufactured by Adeka Corporation).

In the present invention, as the photoradical polymerization initiator, an oxime compound having a benzofuran skeleton can also be used. Specific examples include OE-01 to OE-75 described in WO2015/036910A.

Hereinafter, specific examples of the oxime compound which are preferably used in the present invention are shown below, but the present invention is not limited thereto.

(C-1)

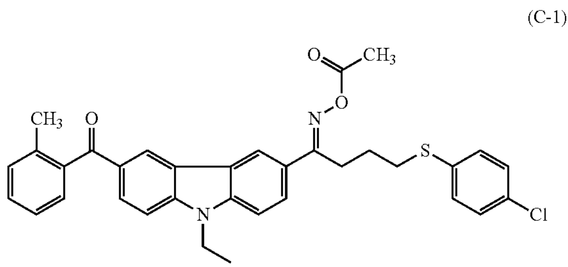

(C-2)

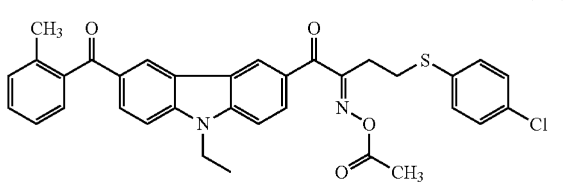

(C-3)

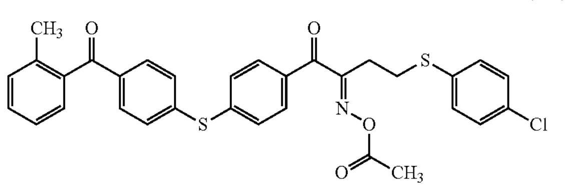

(C-4)

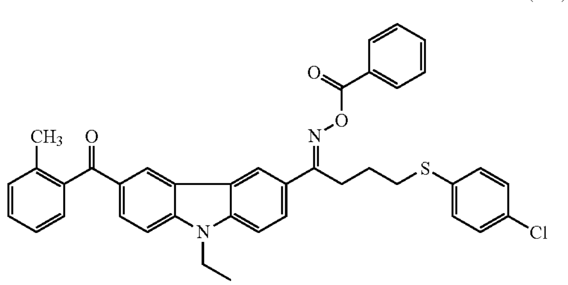

(C-5)

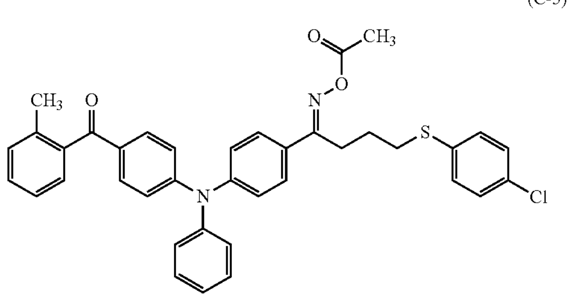

(C-6)

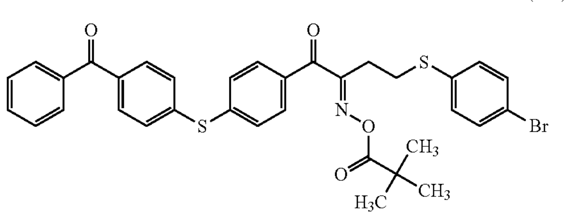

-continued (C-7)

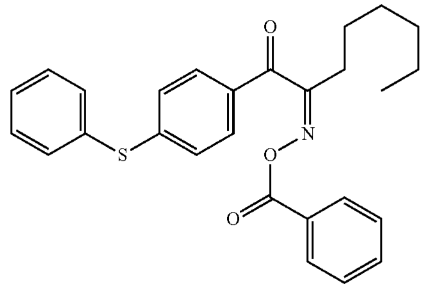

(C-8)

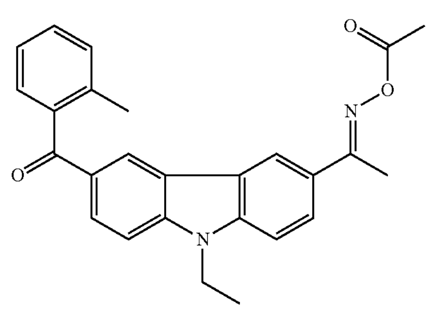

(C-9)

(C-10)

(C-11)

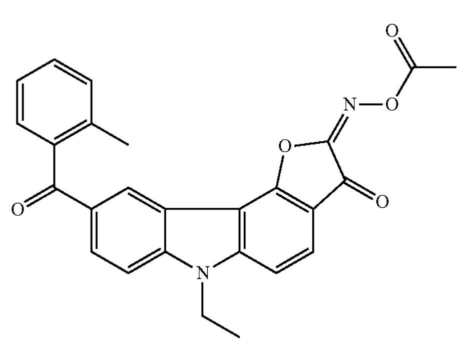

-continued (C-12)

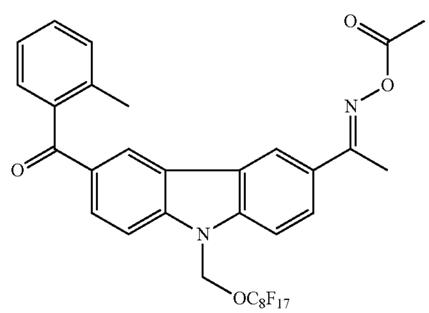

(C-13)

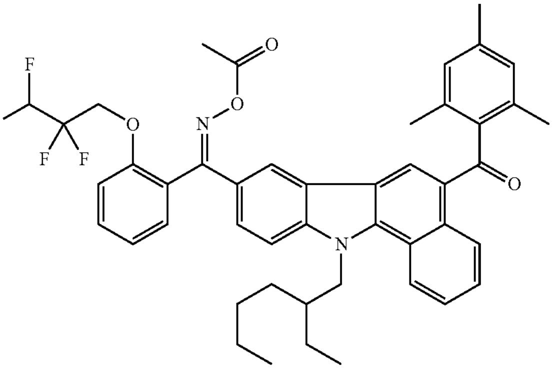

(C-14)

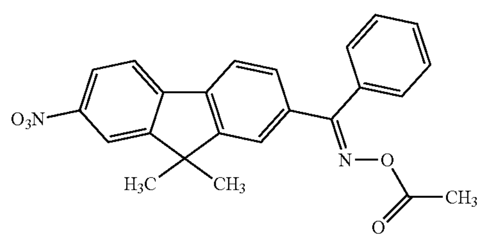

(C-15)

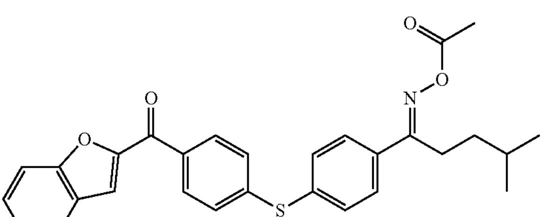

(C-16)

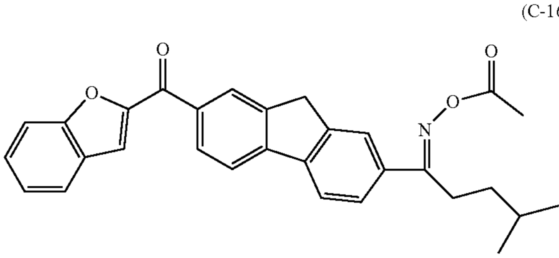

The oxime compound is preferably a compound having a maximum absorption wavelength in a wavelength range of 350 to 500 nm and more preferably a compound having a maximum absorption wavelength in a wavelength range of 360 to 480 nm. In addition, the molar absorption coefficient of the oxime compound at a wavelength of 365 nm or 405 nm is preferably high, more preferably 1,000 to 300,000, still more preferably 2,000 to 300,000, and still more preferably 5,000 to 200,000 from the viewpoint of sensitivity. The molar absorption coefficient of the compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

In the present invention, as the photoradical polymerization initiator, a photoradical polymerization initiator having two functional groups or three or more functional groups may be used. By using this photoradical polymerization initiator, two or more radicals are generated from one molecule of the photoradical polymerization initiator. Therefore, excellent sensitivity can be obtained. In addition, in a case where a compound having an asymmetric structure is used, crystallinity deteriorates, solubility in a solvent or the like is improved, precipitation is not likely to occur over time, and temporal stability of the composition can be improved. Specific examples of the photoradical polymerization initiator having two functional groups or three or more functional groups include a dimer of an oxime compound described in JP2010-527339A, JP2011-524436A, WO2015/004565A, paragraphs "0417" to "0412" of JP2016-532675A, or paragraphs "0039" to "0055" of WO2017/033680A, a compound (E) and a compound (G) described in JP2013-522445A, Cmpd 1 to 7 described in WO2016/034963A, an oxime ester photoinitiator described in paragraph "0007" of JP2017-523465A, a photoinitiator described in paragraphs "0020" to "0033" of JP2017-167399A, and a photopolymerization initiator (A) described in paragraphs "0017" to "0026" of JP2017-151342A.

As the photoradical polymerization initiator, it is also preferable that an oxime compound and an α-aminoketone compound are used. By using the oxime compound and the α-aminoketone compound in combination, the developability is improved, and a pattern having excellent rectangularity can be easily formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photoradical polymerization initiator is preferably 0.1 to 50 mass %, more preferably 0.5 to 30 mass %, and still more preferably 1 to 20 mass % with respect to the total solid content of the composition according to the embodiment of the present invention. In a case where the content of the photoradical polymerization initiator is in the above-described range, higher sensitivity and pattern formability can be obtained. The composition according to the embodiment of the present invention may include one photoradical polymerization initiator or two or more photoradical polymerization initiators. In a case where the composition includes two or more photoradical polymerization initiators, it is preferable that the total content of the two or more photoradical polymerization initiators is in the above-described range.

(Photocationic Polymerization Initiator)

Examples of the photocationic polymerization initiator include a photoacid generator. Examples of the photoacid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodisulfone, disulfone, or o-nitrobenzyl sulfonate. The details of the photocationic polymerization initiator can be found in paragraphs "0139" to "0214" of JP2009-258603A, the content of which is incorporated herein by reference.

The content of the photocationic polymerization initiator is preferably 0.1 to 50 mass %, more preferably 0.5 to 30 mass %, and still more preferably 1 to 20 mass % with respect to the total solid content of the composition according to the embodiment of the present invention. In a case where the content of the photocationic polymerization initiator is in the above-described range, higher sensitivity and pattern formability can be obtained. The composition according to the embodiment of the present invention may include one photocationic polymerization initiator or two or more photocationic polymerization initiators. In a case where the composition includes two or more photocationic polymerization initiators, it is preferable that the total content of the two or more photocationic polymerization initiators is in the above-described range.

<<Polyfunctional Thiol>>

The composition according to the embodiment of the present invention may include a polyfunctional thiol. The polyfunctional thiol is a compound having two or more thiol (SH) groups. By using the above-described photoradical polymerization initiator in combination, the polyfunctional thiol functions as a chain transfer agent in the process of radical polymerization after light irradiation such that a thiyl radical that is not likely to undergo polymerization inhibition due to oxygen is generated. Therefore, the sensitivity of the composition can be improved. In particular, it is preferable that the SH group is a polyfunctional aliphatic thiol that is bonded to an aliphatic group such as an ethylene group.

Examples of the polyfunctional thiol include hexanedithiol, decanedithiol, 1,4-butanediol bisthio propionate, 1,4-butanediolbisthioglycolate, ethylene glycol bisthioglycolate, ethylene glycol bisthiopropionate, trimethylolpropane tristhioglycolate, trimethylolpropane tristhiopropionate, trimethylolethane tris(3-mercaptobutyrate), trimethylolpropane tris(3-mercaptobutyrate), trimethylolpropane tris(3-mercaptopropionate), pentaerythritol tetrakisthioglycolate, pentaerythritol tetrakisthiopropionate, pentaerythritol tetrakis (3-mercaptopropionate), dipentaerythritol hexakis(3-mercaptopropionate), trimercaptopropionic acid tris(2-hydroxyethyl)isocyanurate, 1,4-dimethylmercaptobenzene, 2,4,6-trimercapto-s-triazine, and 2-(N,N-dibutylamino)-4,6-dimercapto-s-triazine. In addition, for example, a compound having the following structure can also be used.

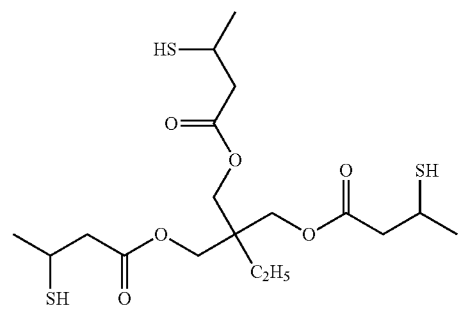

-continued

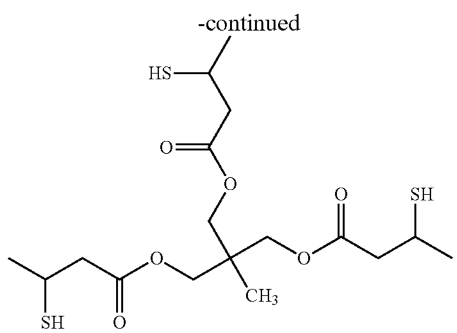

The content of the polyfunctional thiol is preferably 0.1 to 20 mass %, more preferably 0.1 to 15 mass %, and still more preferably 0.1 to 10 mass % with respect to the total solid content of the composition according to the embodiment of the present invention. The composition according to the embodiment of the present invention may include one polyfunctional thiol or two or more polyfunctional thiols. In a case where the composition includes two or more polyfunctional thiols, it is preferable that the total content of the two or more polyfunctional thiols is in the above-described range.

<<Resin>>

It is preferable that the composition according to the embodiment of the present invention includes a resin. The resin is mixed, for example, in order to disperse the pigment and the like in the composition or to be used as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2,000 to 2,000,000. The upper limit is preferably 1,000,000 or lower and more preferably 500,000 or lower. The lower limit is preferably 3000 or higher and more preferably 5000 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or a mixture of two or more kinds may be used. In addition, as the resin, a resin described in Examples of WO2016/088645A, a resin described in JP2017-057265A, a resin described in JP2017-032685A, a resin described in JP2017-075248A, a resin described in JP2017-066240A, or a resin described in JP2017-167513A can also be used, the contents of which are incorporated herein by reference. In addition, a resin having a fluorene skeleton can also be preferably used. Examples of the resin having a fluorene skeleton include a resin having the following structure. In the following structural formula, A represents a residue of a carboxylic dianhydride selected from pyromellitic dianhydride, benzophenone tetracarboxylic dianhydride, biphenyl tetracarboxylic dianhydride, or diphenyl ether tetracarboxylic dianhydride, and M represents a phenyl group or a benzyl group. The details of the resin having a fluorene skeleton can be found in US2017/0102610A, the content of which is incorporated herein by reference.

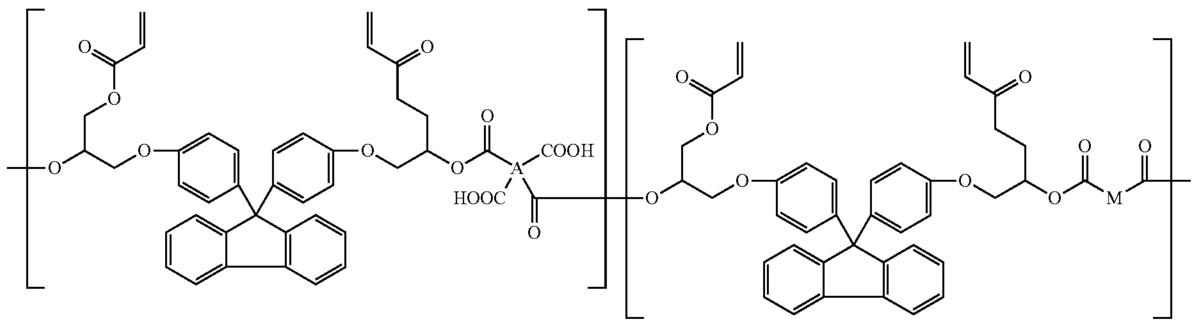

The resin used in the present invention may have an acid group. Examples of the acid group include a carboxyl group, a phosphate group, a sulfo group, and a phenolic hydroxy group. Among these, a carboxyl group is preferable. Among these acid groups, one kind may be used alone, or two or more kinds may be used in combination. The resin having an acid group can also be used as an alkali-soluble resin.

As the resin having an acid group, a polymer having a carboxyl group at a side chain is preferable. Specific examples of the resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group at a side chain thereof, and a resin obtained by adding an acid anhydride to a polymer having a hydroxy group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth) acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, one kind may be used alone, or two or more kinds may be used in combination.

The resin having an acid group may further have a polymerizable group. Examples of the polymerizable group include an allyl group, a methallyl group, and a (meth) acryloyl group. Examples of a commercially available product of the resin include DIANAL NR series (manufactured by Mitsubishi Rayon Co., Ltd.), PHOTOMER 6173 (a carboxyl group-containing polyurethane acrylate oligomer; manufactured by Diamond Shamrock Co., Ltd.), VISCOAT R-264 and KS Resist 106 (both of which are manufactured by Osaka Organic Chemical Industry Ltd.), CYCLOMER series (for example, ACA230AA or ACA250) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

As the resin having an acid group, a copolymer including benzyl (meth)acrylate and (meth)acrylic acid; a copolymer consisting of benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer that includes a repeating unit derived from monomer components including a compound represented by the following Formula (ED1) and/or a compound represented by the following Formula (ED2) (hereinafter, these compounds will also be referred to as "ether dimer") is also preferable.

(ED1)

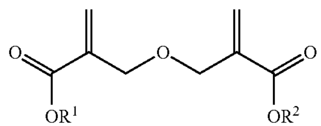

In Formula (ED1), $R^1$ and $R^2$ each independently represent a hydrogen atom or a hydrocarbon group having 1 to 25 carbon atoms which may have a substituent.

(ED2)

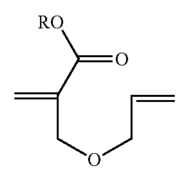

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph "0317" of JP2013-29760A, the content of which is incorporated herein by reference. Among these ether dimers, one kind may be used alone, or two or more kinds may be used in combination.

The resin having an acid group may include a repeating unit which is derived from a compound represented by the following Formula (X).

(X)

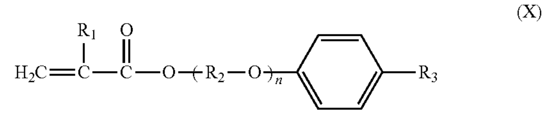

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

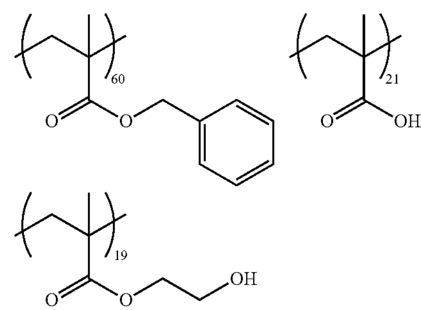

-continued

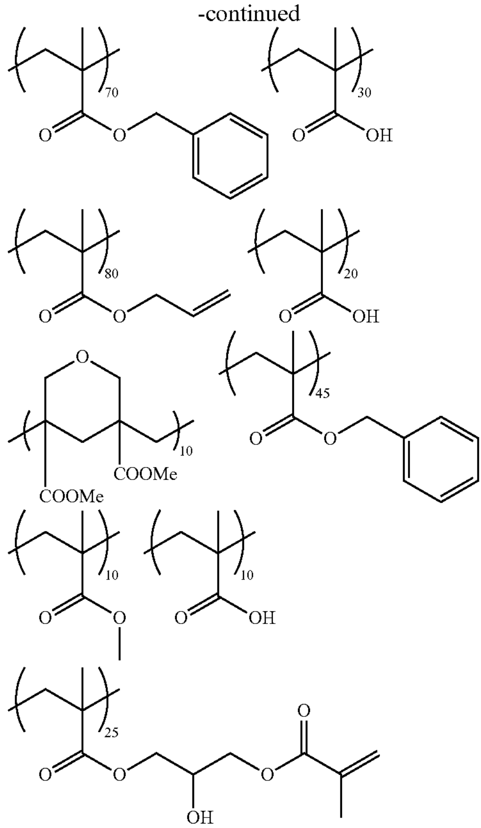

The composition according to the embodiment of the present invention may include a resin as a dispersant. Examples of the dispersant include an acidic dispersant (acidic resin) and a basic dispersant (basic resin). Here, the acidic dispersant (acidic resin) refers to a resin in which the content of an acid group is more than the content of a basic group. In a case where the sum of the content of an acid group and the content of a basic group in the acidic dispersant (acidic resin) is represented by 100 mol %, the content of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the content of a basic group is more than the content of an acid group. In a case where the sum of the content of an acid group and the content of a basic group in the basic dispersant (basic resin) is represented by 100 mol %, the content of the basic group in the basic resin is preferably higher than 50 mol %. The basic group in the basic dispersant is preferably an amino group.

It is preferable that the resin A used as the dispersant further includes a repeating unit having an acid group. By the resin, which is used as the dispersant, including the repeating unit having an acid group, in a case where a pattern is formed using a photolithography method, the amount of residues formed in an underlayer of a pixel can be reduced.

It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference. In addition, specific examples of the graft copolymer include the following resins. The following resin may also be a resin having an acid group (alkali-soluble resin). In addition, other examples of the graft copolymer include resins described in paragraphs "0072" to "0094" of JP2012-255128A, the content of which is incorporated herein by reference.

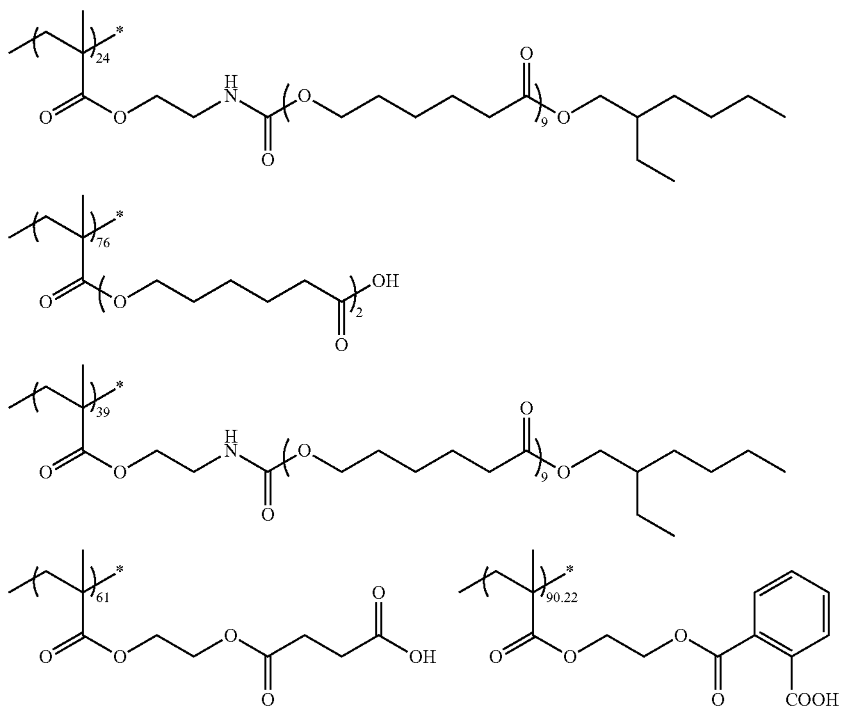

-continued

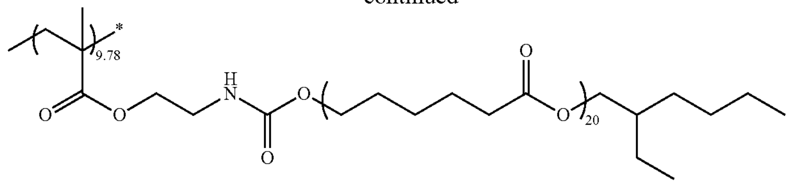

In addition, in the present invention, as the resin (dispersant), an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain including a side chain Y having 40 to 10000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs “0102” to “0166” of JP2012-255128A, the content of which is incorporated herein by reference. As the oligoimine dispersant, a resin having the following structure or a resin described in paragraphs “0168” to “0174” of JP2012-255128A can be used.

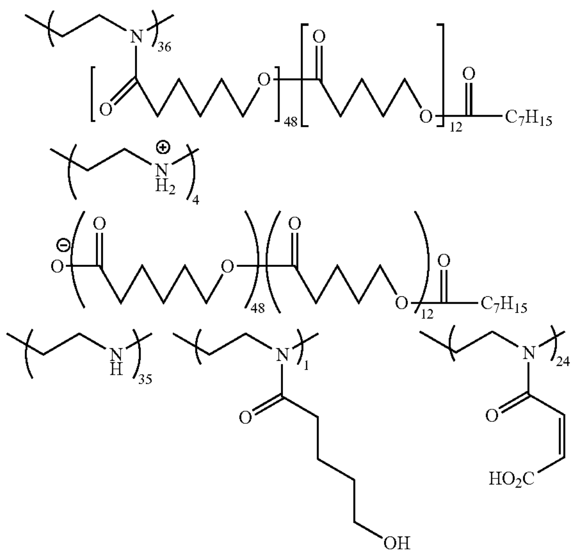

The dispersant is available as a commercially available product, and specific examples thereof include BYK 2000 (manufactured by BYK Chemie). In addition, a pigment dispersant described in paragraphs “0041” to “0130” of JP2014-130338A can also be used, the content of which is incorporated herein by reference. In addition, the resin having an acid group or the like can also be used as a dispersant.

In a case where the composition according to the embodiment of the present invention includes a resin, the content of the resin is preferably 1 to 50 mass % with respect to the total solid content of the composition according to the embodiment of the present invention. The lower limit is preferably 2 mass % or higher, more preferably 3 mass % or higher, still more preferably 5 mass % or higher, and still more preferably 10 mass % or higher. The upper limit is more preferably 40 mass % or lower, and still more preferably 30 mass % or lower. In addition, the content of the resin having an acid group is preferably 1 to 50 mass % with respect to the total solid content of the composition according to the embodiment of the present invention. The lower limit is preferably 2 mass % or higher, more preferably 3 mass % or higher, still more preferably 5 mass % or higher, and still more preferably 10 mass % or higher. The upper limit is more preferably 40 mass % or lower, and still more preferably 30 mass % or lower. The composition according to the embodiment of the present invention may include one resin or two or more resins. In a case where the composition includes two or more resins, it is preferable that the total content of the two or more resins is in the above-described range.

In a case where the composition according to the embodiment of the present invention includes the radically polymerizable compound and the resin, a mass ratio radically polymerizable compound/resin of the radically polymerizable compound to the resin is preferably 0.4 to 1.4. The lower limit of the mass ratio is preferably 0.5 or higher and more preferably 0.6 or higher. The upper limit of the mass ratio is preferably 1.3 or lower and more preferably 1.2 or lower. In a case where the mass ratio is in the above-described range, a pattern having more excellent rectangularity can be formed.

In addition, it is preferable that a mass ratio radically polymerizable compound/resin having an acid group of the radically polymerizable compound to the resin having an acid group is 0.4 to 1.4. The lower limit of the mass ratio is preferably 0.5 or higher and more preferably 0.6 or higher. The upper limit of the mass ratio is preferably 1.3 or lower and more preferably 1.2 or lower. In a case where the mass ratio is in the above-described range, a pattern having more excellent rectangularity can be formed.

<<Pigment Derivative>>

The composition according to the embodiment of the present invention may further include a pigment derivative. Examples of the pigment derivative include a compound having a structure in which a portion of a pigment is substituted with an acid group, a basic group, a group having a salt structure, or a phthalimidomethyl group. As the pigment derivative, a compound represented by Formula (B1) is preferable.

$$P\text{-}(\text{L-}(X)_n)_m \tag{B1}$$

In Formula (B1), P represents a colorant structure, L represents a single bond or a linking group, X represents an acid group, a basic group, a group having a salt structure, or a phthalimidomethyl group, m represents an integer of 1 or more, n represents an integer of 1 or more, in a case where m represents 2 or more, a plurality of L’s and a plurality of X’s may be different from each other, and in a case where n represents 2 or more, a plurality of X’s may be different from each other.

The colorant structure represented by P is preferably at least one selected from a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a perylene colorant structure, a perinone colorant structure, a benzimidazolone colorant structure, a benzothiazole colorant structure, a benzimidazole colorant structure, or a benzoxazole colorant structure, more preferably at least one selected from a pyrrolopyrrole colorant structure, a diketo pyrrolopyrrole colorant structure, a quinacridone colorant structure, or a benzimidazolone colorant structure, and still more preferably a pyrrolopyrrole colorant structure.

Examples of the linking group represented by L include a hydrocarbon group, a heterocyclic group, —NR—, $—SO_2—$, —S—, —O—, —CO—, and a group consisting of a combination thereof. R represents a hydrogen atom, an alkyl group, or an aryl group.

Examples of the acid group represented by X include a carboxyl group, a sulfo group, a carboxylic acid amide group, a sulfonic acid amide group, and an imide acid group. As the carboxylic acid amide group, a group represented by $—NHCOR^{X1}$ is preferable. As the sulfonic acid amide group, a group represented by $—NHSO_2R^{X2}$ is preferable. As the imide acid group, a group represented by $—SO_2NHSO_2R^{X3}$, $—CONHSO_2R^{X4}$, $—CONHCOR^{X5}$, or $—SO_2NHCOR^{X6}$ is preferable. $R^{X1}$ to $R^{X6}$ each independently represent a hydrocarbon group or a heterocyclic group. The hydrocarbon group and the heterocyclic group represented by $R^{X1}$ to $R^{X6}$ may further have a substituent. Examples of the substituent which may be further included include the above-described substituent T. Among these, a halogen atom is preferable and a fluorine atom is more preferable. Examples of the basic group represented by X include an amino group. The amino group is preferably a group represented by $—NR^{100}R^{101}$. $R^{100}$ to $R^{101}$ each independently represent a hydrogen atom, a hydrocarbon group, or a heterocyclic group. The hydrocarbon group and the heterocyclic group represented by $R^{100}$ to $R^{101}$ may further have a substituent. Examples of the substituent include the above-described substituent T. The phthalimidomethyl group represented by X may be unsubstituted or may have a substituent. Examples of the substituent include the above-described substituent T. Examples of the salt structure represented by X include a salt of the acid group or the basic group described above.

Examples of the pigment derivative include compounds having the following structures. In addition, for example, compounds described in JP1981-118462A (JP-S56-118462A), JP1988-264674A (JP-S63-264674A), JP1989-217077A (JP-H1-217077A), JP1991-009961A (JP-H3-009961A), JP1991-026767A (JP-H3-026767A), JP1991-153780A (JP-H3-153780A), JP1991-045662A (JP-H3-045662A), JP1992-285669A (JP-H4-285669A), JP1994-145546A (JP-H6-145546A), JP1994-212088A (JP-H6-212088A), JP1994-240158A (JP-H6-240158A), JP1998-030063A (JP-H10-030063A), JP1998-195326A (JP-H10-195326A), paragraphs "0086" to "0098" of WO2011/024896A, paragraphs "0063" to "0094" of WO2012/102399A, paragraph "0082" of WO2017/038252A, and JP5299151B can be used, the contents of which are incorporated herein by reference.

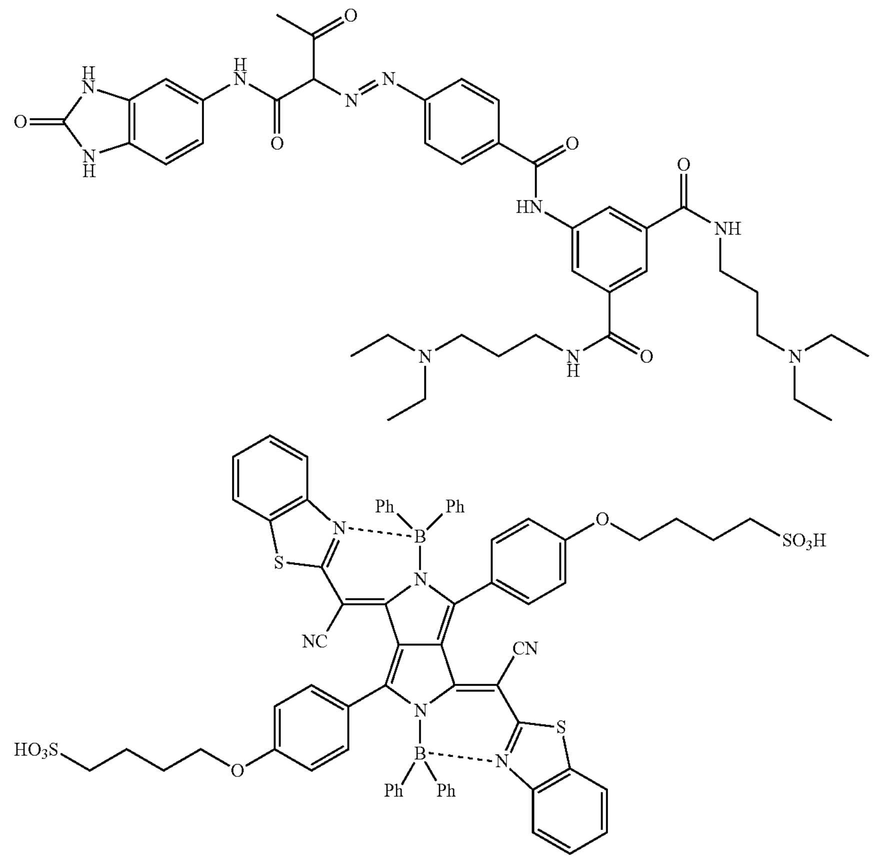

-continued

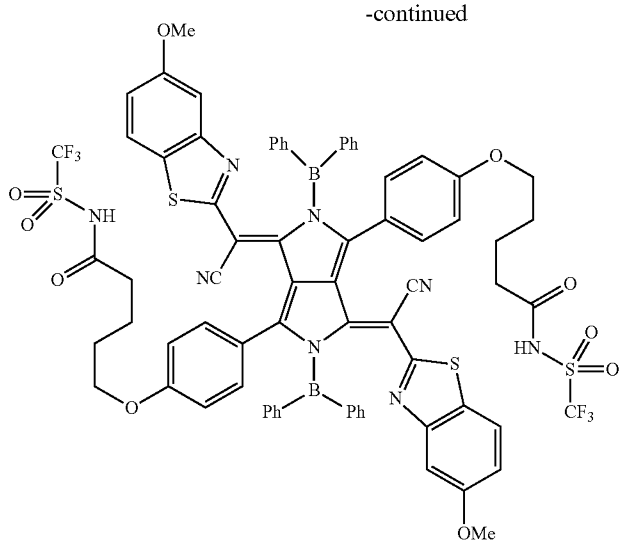

In a case where the composition according to the embodiment of the present invention includes the pigment derivative, the content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the pigment dispersibility can be improved, and aggregation of the pigment can be efficiently suppressed. As the pigment derivative, one kind may be used alone, or two or more kinds may be used in combination. In a case where two or more pigment derivatives are used, it is preferable that the total content of the two or more pigment derivatives is in the above-described range.

<<Polymerization Inhibitor>>

The composition according to the embodiment of the present invention may include a polymerization inhibitor. Examples of the polymerization inhibitor include hydroquinone, p-methoxyphenol, di-tert-butyl-p-cresol, pyrogallol, t-butylcatechol, benzoquinone, 4,4'-thiobis(3-methyl-6-tert-butylphenol), 2,2'-methylenebis(4-methyl-6-tert-butylphenol), and N-nitrosophenylhydroxyamine salt (for example, an ammonium salt or a cerium (III) salt). Among these, p-methoxyphenol is preferable. The content of the polymerization inhibitor is preferably 0.0001 to 5 mass % with respect to the composition according to the embodiment of the present invention.

<<Silane Coupling Agent>>

The composition according to the embodiment of the present invention may include a silane coupling agent. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the contents of which are incorporated herein by reference.

The content of the silane coupling agent is preferably 0.01 to 15.0 mass % and more preferably 0.05 to 10.0 mass % with respect to the total solid content of the composition according to the embodiment of the present invention. As the silane coupling agent, one kind may be used alone, or two or more kinds may be used. In a case where two or more silane coupling agents are used, it is preferable that the total content of the two or more silane coupling agents is in the above-described range.

<<Surfactant>>

The composition according to the embodiment of the present invention may include a surfactant. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

In the present invention, it is preferable that the surfactant is a fluorine surfactant. By the composition according to the embodiment of the present invention containing a fluorine surfactant, liquid characteristics (for example, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

In addition, as the fluorine surfactant, a polymer of a fluorine-containing vinyl ether compound having a fluorinated alkyl group or a fluorinated alkylene ether group and a hydrophilic vinyl ether compound is also preferable. The details of this fluorine surfactant can be found in JP2016-216602A, the content of which is incorporated herein by reference.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

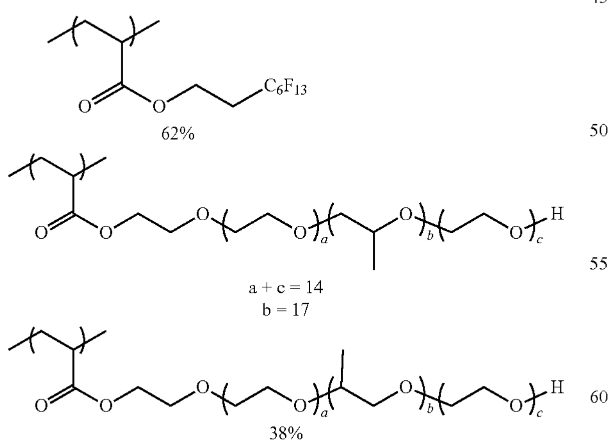

The weight-average molecular weight of the compound is preferably 3,000 to 50,000 and, for example, 14,000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE)), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010, SURFYNOL 104, 400, and 440 (all of which are manufactured by Nissin Chemical Co., Ltd.).

The content of the surfactant is preferably 0.001 mass % to 5.0 mass % and more preferably 0.005 to 3.0 mass % with respect to the total solid content of the composition according to the embodiment of the present invention. As the surfactant, one kind may be used alone, or two or more kinds may be used. In a case where two or more surfactants are used, it is preferable that the total content of the two or more surfactants is in the above-described range.

<<Ultraviolet Absorber>>

The composition according to the embodiment of the present invention can include an ultraviolet absorber. As the ultraviolet absorber, a conjugated diene compound, an amino diene compound, a salicylate compound, a benzophenone compound, a benzotriazole compound, an acrylonitrile compound, a hydroxyphenyltriazine compound an indole compound, or a triazine compound can be used. The details of the ultraviolet absorber can be found in paragraphs "0052" to "0072" of JP2012-208374A, paragraphs "0317" to "0334" of JP2013-068814A, and paragraphs "0061" to "0080" of JP2016-162946A, the contents of which are incorporated herein by reference. Specific examples of the ultraviolet absorber include compounds having the following structures. Examples of a commercially available product of the ultraviolet absorber include UV-503 (manufactured by Daito Chemical Co., Ltd.). In addition, examples of the benzotriazole compound include MYUA series (manufactured by Miyoshi Oil&Fat Co., Ltd.; The Chemical Daily, Feb. 1, 2016).

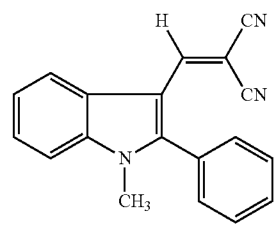

-continued

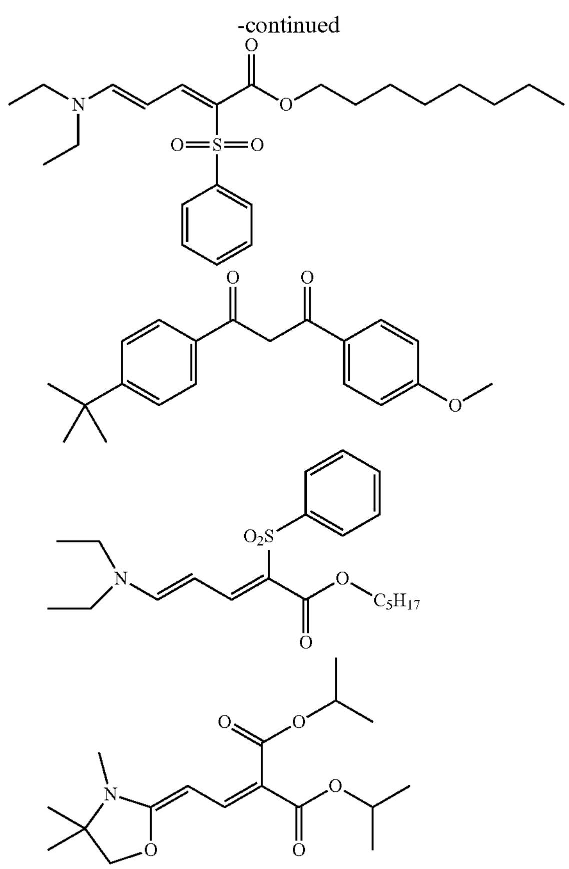

The content of the ultraviolet absorber is preferably 0.01 to 10 mass % and more preferably 0.01 to 5 mass % with respect to the total solid content of the composition according to the embodiment of the present invention. As the ultraviolet absorber, one kind may be used alone, or two or more kinds may be used in combination. In a case where two or more ultraviolet absorbers are used, it is preferable that the total content of the two or more ultraviolet absorbers is in the above-described range.

<<Antioxidant>>

The composition according to the embodiment of the present invention may include an antioxidant. Examples of the antioxidant include a phenol compound, a phosphite compound, and a thioether compound. As the phenol compound, any phenol compound which is known as a phenol antioxidant can be used. As the phenol compound, for example, a hindered phenol compound is preferable. A compound having a substituent at a position (ortho position) adjacent to a phenolic hydroxyl group is preferable. As the substituent, a substituted or unsubstituted alkyl group having 1 to 22 carbon atoms is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include tris[2-[[2,4, 8,10-tetrakis(1,1-dimethylethyl) dibenzo[d,f][1,3,2]dioxaphosphepin-6-yl]oxy]ethyl]amine, tris[2-[(4,6, 9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. Examples of the commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). In addition, as the antioxidant, a polyfunctional hindered amine antioxidant described in WO17/006600A or an antioxidant described in WO2017/164024A can also be used.

The content of the antioxidant is preferably 0.01 to 20 mass % and more preferably 0.3 to 15 mass % with respect to the mass of the total solid content of the composition according to the embodiment of the present invention. As the antioxidant, one kind may be used alone, or two or more kinds may be used in combination. In a case where two or more antioxidants are used, it is preferable that the total content of the two or more antioxidants is in the above-described range.

<<Other Components>>

Optionally, the composition according to the embodiment of the present invention may further include a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an aroma chemical, a surface tension adjuster, or a chain transfer agent). By the composition appropriately including the components, properties such as film properties can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the contents of which are incorporated herein by reference. In addition, the composition according to the embodiment of the present invention may optionally include a potential antioxidant. The potential antioxidant is a compound in which a portion that functions as the antioxidant is protected by a protective group and this protective group is desorbed by heating the compound at 100° C. to 250° C. or by heating the compound at 80° C. to 200° C. in the presence of an acid/a base catalyst. Examples of the potential antioxidant include a compound described in WO2014/021023A, WO2017/030005A, and JP2017-008219A. Examples of a commercially available product of the potential antioxidant include ADEKA ARKLS GPA-5001 (manufactured by Adeka Corporation).

The concentration of solid contents of the composition according to the embodiment of the present invention is preferably 5 to 50 mass %. The upper limit is preferably 45 mass % or lower and more preferably 40 mass % or lower. The lower limit is 8 mass % or higher and more preferably 10 mass % or higher.

For example, in a case where a film is formed by coating, the viscosity (23° C.) of the composition according to the embodiment of the present invention is preferably 1 to 100 mPa·s. The lower limit is preferably 2 mPa·s or higher and more preferably 3 mPa·s or higher. The upper limit is more preferably 50 mPa·s or lower, still more preferably 30 mPa·s or lower, and still more preferably 15 mPa·s or lower.

A storage container of the composition according to the embodiment of the present invention is not particularly limited, and a well-known storage container can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

The composition according to the embodiment of the present invention can be preferably used as a composition for forming an infrared transmitting filter.

<Method of Preparing Composition>

The composition according to the embodiment of the present invention can be prepared by mixing the above-described components with each other. During the preparation of the composition, all the components may be dissolved or dispersed in a solvent at the same time to prepare the composition. Optionally, two or more solutions or dispersion liquids to which the respective components are appropriately added may be prepared, and the solutions or dispersion liquids may be mixed with each other during use (during application) to prepare the composition.

In addition, it is preferable that a process of dispersing the pigment is provided in order to prepare the composition. Examples of a mechanical force used for dispersing the pigment in the process of dispersing the pigment include compression, squeezing, impact, shearing, and cavitation. Specific examples of a unit that realizes the process include a beads mill, a sand mill, a roll mill, a ball mill, a paint shaker, a Microfluidizer, a high-speed impeller, a sand grinder, a flow jet mixer, high-pressure wet atomization, and ultrasonic dispersion. During the pulverization of the pigment using a sand mill (beads mill), it is preferable that the process is performed under conditions for increasing the pulverization efficiency, for example, by using beads having a small size and increasing the filling rate of the beads. In addition, it is preferable that coarse particles are removed by filtering, centrifugal separation, and the like after pulverization. In addition, as the process and the disperser for dispersing the pigment, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be used. In addition, in the process of dispersing the pigment, a pigment may be refined in a salt milling step. A material, a device, process conditions, and the like used in the salt milling step can be found in, for example, JP2015-194521A and JP2012-046629A.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is preferably 0.01 to 7.0 μm, more preferably 0.01 to 3.0 μm, and still more preferably 0.05 to 0.5 μm. In a case where the pore size of the filter is in the above-described range, fine foreign matter can be more reliably removed. The pore size value of the filter can refer to a nominal value of a manufacturer of the filter. As the filter, various filters manufactured by Pall Corporation (for example, DFA4201NIEY), Toyo Roshi Kaisha, Ltd., Entegris Japan Co., Ltd. (former Mykrolis Corporation), or Kits Microfilter Corporation can be used.

In addition, it is also preferable that a fibrous filter material is used as the filter. Examples of the fibrous filter material include polypropylene fiber, nylon fiber, and glass fiber. Specific examples of a commercially available product of the fibrous filter material include SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more. In addition, a combination of filters having different pore sizes in the above-described range may be used. In addition, the filtering using the first filter may be performed only on the dispersion liquid, and the filtering using the second filter may be performed on a mixture of the dispersion liquid and other components.

<Film>

Next, a film according to the embodiment of the present invention will be described. The film according to the embodiment of the present invention is obtained from the above-described composition according to the embodiment of the present invention. The film according to the embodiment of the present invention can be preferably used as an infrared transmitting filter.

In the film according to the embodiment of the present invention, a transmittance with respect to light having a wavelength of 700 nm is preferably 20% or lower, more preferably 15% or lower, and still more preferably 10% or lower. In addition, a transmittance with respect to light having a wavelength of 810 nm is preferably 70% or higher, more preferably 75% or higher, and still more preferably 80% or higher. In addition, a maximum value of a transmittance with respect to light in a wavelength range of 400 to 700 nm is preferably 20% or lower, more preferably 15% or lower, and still more preferably 10% or lower. In addition, a minimum value of a transmittance with respect to light in a wavelength range of 810 to 1100 nm is preferably 70% or higher, more preferably 75% or higher, and still more preferably 80% or higher.

The thickness of the film according to the embodiment of the present invention can be adjusted according to the purpose. The thickness is preferably 10.0 μm or less, more preferably 5.0 μm or less, still more preferably 3.0 μm or less, still more preferably 2.5 μm or less, still more preferably 2.0 μm or less, and still more preferably 1.5 μm or less. The lower limit of the thickness of the film is preferably 0.4 μm or more, more preferably 0.5 μm or more, still more preferably 0.6 μm or more, still more preferably 0.7 μm or more, still more preferably 0.8 μm or more, and still more preferably 0.9 μm or more.

<Film Forming Method>

Next, a film forming method according to the embodiment of the present invention will be described. The film according to the embodiment of the present invention can be formed through a step of applying the composition according to the embodiment of the present invention.

In the film forming method according to the embodiment of the present invention, it is preferable that the composition is applied to a support. Examples of the support include a substrate formed of a material such as silicon, non-alkali glass, soda glass, PYREX (registered trade name) glass, or quartz glass. For example, an organic film or an inorganic film may be formed on the substrate. Examples of a material of the organic film include the resin described above regarding the composition. In addition, as the support, a substrate formed of the resin can also be used. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat. In addition, in a case where a glass substrate is used as the support, it is preferable that an inorganic film is formed on the glass substrate or the glass substrate may be dealkalized to be used.

As a method of applying the composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent-" (February, 2005, S.B. Research Co., Ltd.) and methods described in JP2003-262716A, JP2003-185831A, JP2003-261827A, JP2012-126830A, and JP2006-169325A. In addition, it is preferable that the application using a spin coating method is performed at a rotation speed of 1000 to 2000 rpm. In addition, during the coating using a spin coating method, the rotation speed may be increased as described in JP1998-142603A (JP-H10-146203A), JP1999-302413A (JP-H11-302413A), or JP2000-157922A. In addition, a spin coating process described in "Process Technique and Chemicals for Latest Color Filter" (Jan. 31, 2006, CMC Publishing Co., Ltd.) can also be suitably used. In addition, examples of the method of applying the composition include methods described in WO2017/030174A and WO2017/018419A, the contents of which are incorporated herein by reference.

A composition layer (coating film) formed by applying the composition may be dried (pre-baked). In a case where a film is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. The pre-baking time is preferably 10 to 3000 seconds, more preferably 40 to 2500 seconds, and still more preferably 80 to 220 seconds. Pre-baking can be performed using a hot plate, an oven, or the like.

It is also preferable that the film forming method further includes a step of forming a pattern. Examples of a pattern forming method include a pattern forming method using a photolithography method and a pattern forming method using a dry etching method. Among these, a pattern forming method using a photolithography method is preferable. In a case where the film according to the embodiment of the present invention is used as a flat film, the step of forming a pattern is not necessarily performed. Hereinafter, the step of forming a pattern will be described in detail.

(Case where Pattern is Formed Using Photolithography Method)

It is preferable that the pattern forming method using photolithography includes: a step (exposure step) of exposing the composition layer, which is formed by applying the composition according to the embodiment of the present invention, in a pattern shape; and a step (development step) of forming a pattern by removing a non-exposed portion of the composition layer by development. Optionally, the pattern forming method may further include a step (post-baking step) of baking the developed pattern. Hereinafter, the respective steps will be described.

<<Exposure Step>>

In the exposure step, the composition layer is exposed in a pattern shape. For example, the composition layer is exposed in a pattern shape using a stepper exposure device or a scanner exposure device through a mask having a predetermined mask pattern, thereby exposing a pattern. As a result, an exposed portion can be cured. Examples of radiation (light) used during the exposure include a g-ray and an i-ray. In addition, light having a wavelength of 300 nm or shorter (preferably light having a wavelength of 180 to 300 nm) can also be used. Specific examples of the light having a wavelength of 300 nm or shorter include a KrF ray (wavelength: 248 nm) and an ArF ray (wavelength: 193 nm). Among these, a KrF ray (wavelength: 248 nm) is preferable. For example, the irradiation dose (exposure dose) is preferably 0.03 to 2.5 J/cm$^2$, more preferably 0.05 to 1.0 J/cm$^2$, and most preferably 0.08 to 0.5 J/cm$^2$. The oxygen concentration during exposure can be appropriately selected. For example, the exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and, for example, can be selected in a range of 1000 to 100000 W/m$^2$. Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

<<Development Step>>

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photocured portion remains on the support. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

As the developer, an alkaline aqueous solution in which the above alkaline agent is diluted with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethyl ammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. From the viewpoints of environment and safety, it is preferable that the alkaline agent is a compound having a high molecular weight. A concentration of the alkaline agent in the alkaline aqueous solution is preferably 0.001 to 10 mass % and more preferably 0.01 to 1 mass %. In addition, the developer may further include a surfactant. Examples of the surfactant include the above-described surfactants. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where the alkaline aqueous solution is used as the developer, it is preferable that the layer is rinsed with pure water after development. In addition, it is preferable that, during rinsing, a rinsing liquid is supplied to the developed composition layer while rotating the support on which the developed composition layer is formed. In addition, it is also preferable that, during rinsing, a nozzle through which the rinsing liquid is ejected is moved from a center portion of the support to a peripheral portion of the support. At this time, during the movement of the nozzle from the center portion to the peripheral portion of the support, the moving speed of the nozzle may be gradually decreased. By performing rinsing as described above, an in-plane variation of rinsing can be suppressed. In addition, even in a case where the rotation speed of the support is gradually decreased while moving the nozzle from the center portion to the peripheral portion of the support, the same effects can be obtained.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. The film after the development is post-baked continuously or batchwise using a heating unit such as a hot plate, a convection oven (hot air circulation dryer), a high-frequency heater under the above-described temperature conditions.

(Case where Pattern is Formed Using Dry Etching Method)

The formation of a pattern using a dry etching method can be performed using a method including: applying the composition according to the embodiment of the present invention to a support to form a composition layer; curing the composition layer to form a cured composition layer; forming a patterned resist layer on the cured composition layer; and dry-etching the cured composition layer with etching gas by using the patterned resist layer as a mask. The details of the pattern formation using the dry etching method can be found in paragraphs "0010" to "0067" of JP2013-064993A, the content of which is incorporated herein by reference.

<Infrared Transmitting Filter>

Next, an infrared transmitting filter according to the embodiment of the present invention will be described. The infrared transmitting filter according to the embodiment of the present invention includes the film according to the embodiment of the present invention.

The infrared transmitting filter according to the embodiment of the present invention can be used in combination with a color filter that includes a chromatic colorant. The color filter can be manufactured using a coloring composition including a chromatic colorant. The coloring composition may further include, for example, a curable compound, a resin, a photopolymerization initiator, a surfactant, a solvent, a polymerization inhibitor, and an ultraviolet absorber. In addition, it is also preferable that the infrared transmitting filter according to the embodiment of the present invention includes a pixel of the film according to the embodiment of the present invention and a pixel selected from the group consisting of a red pixel, a green pixel, a blue pixel, a magenta pixel, a yellow pixel, a cyan pixel, a black pixel, and an achromatic pixel.

<Solid-State Imaging Element>

A solid-state imaging element according to the present invention includes the infrared transmitting filter according to the present invention. The configuration of the solid-state imaging element is not particularly limited as long as it includes the film according to the embodiment of the present invention and functions as a solid-state imaging element. For example, the following configuration can be adopted.

The solid-state imaging element includes a plurality of photodiodes and transfer electrodes on the support, the photodiodes constituting a light receiving area of the solid-state imaging element, and the transfer electrode consisting of polysilicon or the like. In the solid-state imaging element, a light blocking film consisting of tungsten or the like which has openings through only light receiving sections of the photodiodes is provided on the photodiodes and the transfer electrodes, a device protective film consisting of silicon nitride or the like is formed on the light blocking film so as to cover the entire surface of the light blocking film and the light receiving sections of the photodiodes, and the infrared transmitting filter according to the embodiment of the present invention is formed on the device protective film. Further, a configuration in which a light collecting unit (for example, a microlens; hereinafter, the same shall be applied) is provided above the device protective film and below the infrared transmitting filter (on a side thereof close the support), or a configuration in which a light collecting unit is provided on the infrared transmitting filter may be adopted. In addition, the infrared transmitting filter may have a structure in which a film which forms each pixel of the infrared transmitting filter is embedded in a space which is partitioned in, for example, a lattice form by a partition wall. In this case, it is preferable that the partition wall has a lower refractive index than each pixel. Examples of an imaging device having such a structure include a device described in JP2012-227478A and JP2014-179577A.

It is preferable that the solid-state imaging element according to the embodiment of the present invention includes a band pass filter that is provided on an optical path of the infrared transmitting filter. Examples of the band pass filter include a dielectric multi-layer film. The dielectric multi-layer film is a film that blocks infrared light using a light interference effect. The dielectric multi-layer film can be prepared by alternately laminating a plurality of dielectric thin films (high refractive index material layers) having a high refractive index and a plurality of dielectric thin films (low refractive index material layers) having a low refractive index. The number of the dielectric thin films laminated in the dielectric multi-layer film is preferably 2 to 100, more preferably 4 to 60, and still more preferably 6 to 40.

As a material for forming the high refractive index material layer, a material having a refractive index of 1.7 to 2.5 is preferable. Specific examples of the material include $Sb_2O_3$, $Sb_2S_3$, $Bi_2O_3$, $CeO_2$, $CeF_3$, $HfO_2$, $La_2O_3$, $Nd_2O_3$, $Pr_6O_{11}$, $Sc_2O_3$, SiO, $Ta_2O_5$, $TiO_2$, TlCl, $Y_2O_3$, ZnSe, ZnS, and $ZrO_2$. As a material for forming the low refractive index material layer, a material having a refractive index of 1.2 to 1.6 is preferable. Specific examples of the material include $Al_2O_3$, $BiF_3$, $CaF_2$, $LaF_3$, $PbCl_2$, $PbF_2$, LiF, $MgF_2$, MgO, $NdF_3$, $SiO_2$, $Si_2O_3$, NaF, $ThO_2$, $ThF_4$, and $Na_3AlF_6$.

A method of forming the dielectric multi-layer film is not particularly limited, and examples thereof include a vacuum deposition method such as ion plating or ion beam, a physical vapor deposition method (PVD method) such as sputtering, and a chemical vapor deposition method (CVD method).

The thickness of each of the high refractive index material layer and the low refractive index material layer is preferably $0.1\lambda$ to $0.5\lambda$ of a wavelength $\lambda$ (nm) of infrared light to be blocked. By adjusting the thickness to be in the above-described range, the blocking and transmission of light having a specific wavelength can be easily controlled.

The band pass filter may be provided on an incidence side of light into the near infrared transmitting filter or may be provided on an emission side of light from the near infrared transmitting filter. In addition, the band pass filter may be provided in contact with the infrared transmitting filter, or another layer may be interposed between the band pass filter and the infrared transmitting filter.

It is preferable that the band pass filter is a band pass filter that allows transmission of at least a part of infrared light transmitted through the infrared transmitting filter. In this aspect, infrared light or the like having a small noise can be received by the solid-state imaging element, and the sensor sensitivity or the like of the solid-state imaging element can be improved. It is preferable that the band pass filter is a filter that allows transmission of visible light and transmission of at least a part of infrared light transmitted through the infrared transmitting filter. In particular, in a case where the solid-state imaging element according to the embodiment of the present invention further includes a color filter in addition to the infrared transmitting filter, it is preferable that the band pass filter is a filter that allows transmission of visible light and transmission of at least a part of infrared light transmitted through the infrared transmitting filter.

In the band pass filter, it is preferable that a maximum value of a transmittance in a wavelength range of 730 to 780 nm is 10% or lower (preferably 7% or lower and more preferably 5% or lower), and a minimum value of a transmittance in a wavelength range of 840 to 860 nm is 70% or higher (preferably 80% or higher and more preferably 90% or higher).

In addition, in the band pass filter, it is preferable that a minimum value of a transmittance in a wavelength range of 400 to 700 nm is 70% or higher (preferably 80% or higher and more preferably 90% or higher).

In addition, in the band pass filter, it is preferable that a maximum value of a transmittance in a wavelength range of 900 to 1200 nm is 10% or lower (preferably 7% or lower and more preferably 5% or lower).

Examples of a preferable combination of the near infrared transmitting filter and the band pass filter include the following combinations. In a combination of near infrared transmitting filter and the band pass filter, in a wavelength range of 700 to 850 nm, a wavelength $\lambda 1$ at which a transmittance of the infrared transmitting filter is 50% is shorter than a shortest wavelength $\lambda 2$ at which a transmittance of the band pass filter is 50%, and a difference between the wavelength $\lambda 2$ and the wavelength $\lambda 1$ is 30 nm or longer. The wavelength $\lambda 1$ is preferably 700 to 800 nm and more preferably 720 to 780 nm. The wavelength $\lambda 2$ is preferably 770 to 840 nm and more preferably 790 to 835 nm.

Examples of one embodiment the solid-state imaging element including the infrared transmitting filter and the color filter include a solid-state imaging element having a structure shown in FIG. 1. In FIG. 1, near infrared cut filters 111 and infrared transmitting filters 114 are disposed in an imaging region 110 of the solid-state imaging element. In addition, color filters 112 are laminated on the near infrared cut filters 111. Microlenses 115 are disposed on an incidence ray hv side of the color filters 112 and the infrared transmitting filters 114. A planarizing layer 116 is formed so as to cover the microlenses 115.

Spectral characteristics of the near infrared cut filters 111 can be selected according to the emission wavelength of an infrared light emitting diode (infrared LED) to be used. The color filters 112 is not particularly limited as long as pixels which allow transmission of light having a specific wavelength in a visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference. The infrared transmitting filter 114 is the infrared transmitting filter according to the embodiment of the present invention.

In the infrared sensor shown in FIG. 1, it is preferable that a band pass filter is provided on an optical path of the infrared transmitting filter 114. The band pass filter may be provided on an incidence side of light into the near infrared transmitting filter 114 or may be provided on an emission side of light from the near infrared transmitting filter 114. In addition, the band pass filter may be provided in contact with the infrared transmitting filter 114, or another layer may be interposed between the band pass filter and the infrared transmitting filter 114.

The solid-state imaging element according to the embodiment of the present invention can be used in a state where it is incorporated into a solid-state imaging element or an image display device (for example, a liquid crystal display device or an organic electroluminescence (organic EL) display device) or the like. For example, the solid-state imaging element according to the embodiment of the present invention can be preferably used for applications, for example, for iris recognition, for distance measurement, for a proximity sensor, for a gesture sensor, for a motion sensor, a Time-of-Flight (TOF) sensor, for a vein sensor, for blood vessel visualization, for sebum amount measurement, for fluorescent labeling, or for a surveillance camera.

EXAMPLES

Hereinafter, the present invention will be described in more detail using examples. However, the present invention is not limited to the following examples as long as it does not depart from the scope of the present invention. Unless specified otherwise, "part(s)" represents "part(s) by mass".

<Measurement of Weight-Average Molecular Weight>

The weight-average molecular weight of the resin was measured by gel permeation chromatography (GPC) using the following conditions.

Kind of column: a column in which TOSOH TSK gel Super HZM-H, TOSOH TSK gel Super HZ4000, and TOSOH TSK gel Super HZ2000 were linked to each other Developing solvent: tetrahydrofuran Column temperature: 40° C.

Flow rate (sample injection volume): 1.0 μL (sample concentration: 0.1 mass %)

Device name: HLC-8220 GPC (manufactured by Tosoh Corporation)

Detector: refractive index (RI) detector

Calibration curve base resin: a polystyrene resin

<Manufacturing of Metal Azo Pigment>

(Manufacturing of Metal Azo Pigment 1)

46.2 g of diazobarbituric acid and 38.4 g of barbituric acid were added to 1100 g of distilled water at 85° C. Next, a potassium hydroxide aqueous solution was added to this solution such that the pH is adjusted to about 5, and the solution was stirred for 90 minutes to manufacture an azobarbituric acid precursor.

Next, 1500 g of distilled water at 82° C. was added to the above-described azobarbituric acid precursor. Next, 10 g of 30% hydrochloric acid was added dropwise. Next, 79.4 g of melamine was added. Next, a mixture of 0.282 mol of about 25% zinc chloride solution and 0.0015 mol of about 30% copper (II) chloride solution was added dropwise. Next, the solution to which the components were added was held at a temperature of 82° C. for 3 hours, and then KOH was added thereto such that the pH was adjusted to about 5.5. Next, while increasing the temperature of the solution to 90° C. and maintaining the temperature at 90° C., 100 g of distilled water was added for dilution. Next, 21 g of 30% hydrochloric acid was added dropwise to the solution and was heated at a temperature of 90° C. for 12 hours. Next, a potassium hydroxide aqueous solution was added to the heated solution such that the pH was adjusted to about 5. Next, the pigment was isolated from the solution to a suction filter, was cleaned, was dried in a vacuum drying cabinet at 80° C., and was pulverized in a standard laboratory mill for about 2 minutes. As a result, a metal azo pigment 1 was manufactured.

<Method of Distilling Off Environmentally Regulated Material>

(Manufacturing Example 1) Manufacturing of Polymerizable Monomer D3

50 g of a polyfunctional acrylate (KAYARAD DPHA, manufactured by Nippon Kayaku Co., Ltd.) including 238 mass ppm of toluene as a residual solvent, 50 g of propylene glycol monomethyl ether acetate (PGMEA), and 80 mg of 2,2,6,6-tetramethylpiperidine 1-oxyl (TEMPO) were added to a flask, the outside temperature was set to 90° C., the inside pressure of the flask was gradually decreased from normal pressure to 68 mmHg, and the solvent was distilled off under reduced pressure for 4 hours. Next, PGMEA was adjusted such that the weight in the system was 100 g. As a result, a polyfunctional acrylate solution 1 (polymerizable monomer D3) was obtained. In a case where the amount of the residual solvent (toluene) included in the polyfunctional acrylate solution 1 was measured by gas chromatography, it was verified that the amount of the residual solvent was reduced by 11 mass ppm. In addition, a peak derived from the polyfunctional acrylate (KAYARAD DPHA, manufactured by Nippon Kayaku Co., Ltd.) was detected by nuclear magnetic resonance (1H-NMR), and it was verified that a crosslinking reaction by a radical polymerization did not occur.

(Manufacturing Example 2) Manufacturing of Dispersant C5

50 g of an acrylate compound (ARONIX M-5300, manufactured by Toagosei Co., Ltd.) including 835 mass ppm of toluene as a residual solvent, 50 g of PGMEA, and 40 mg of TEMPO were added to a flask, the outside temperature was set to 90° C., the inside pressure of the flask was gradually decreased from normal pressure to 66 mmHg, and the solvent was distilled off under reduced pressure for 4 hours. Next, PGMEA was adjusted such that the weight in the system was 100 g. As a result, a monomer solution 1 was obtained. In a case where the amount of the residual solvent (toluene) included in the monomer solution 1 was measured by gas chromatography, it was verified that the amount of the residual solvent was reduced by 9 mass ppm. In addition, a peak derived from an acrylate compound (ARONIX M-5300, manufactured by Toagosei Co., Ltd.) was detected by $^{1}$H-NMR, and it was verified that a crosslinking reaction by a radical polymerization did not occur.

1044.2 g of ε-caprolactone, 184.3 g of 3-valerolactone, and 71.6 g of 2-ethyl-1-hexanol were introduced into a three-neck flask, and a mixture was obtained. Next, the above-described mixture was stirred while blowing nitrogen. Next, 0.61 g of monobutyltin oxide was added to the mixture, and the obtained mixture was heated to 90° C. After 6 hours, disappearance of a signal derived from 2-ethyl-1-hexanol in the mixture was verified by $^{1}$H-NMR, and the mixture was heated to 110° C. After continuing the polymerization reaction in nitrogen at 110° C. for 12 hours, disappearance of signals derived from ε-caprolactone and 6-valerolactone was verified by $^{1}$H-NMR. Next, the molecular weight of the obtained compound was measured by GPC. After verifying that the molecular weight of the compound reached a desired value, 0.35 g of 2,6-di-t-butyl-4-methylpheno was added to the mixture including the above-described compound. Further, 87.0 g of 2-methacryloyloxyethyl isocyanate was added dropwise to the obtained mixture for 30 minutes. After 6 hours from completion of the dropwise addition, disappearance of a signal derived from 2-methacryloyloxyethyl isocyanate (MOI) was verified by $^{1}$H-NMR, and 1387.0 g of PGMEA was added to the mixture. As a result, 2770 g of a macromonomer A-1 solution having a concentration of 50 mass % was obtained. A structure (represented by Formula (A-1)) of the macromonomer A-1 was verified by $^{1}$H-NMR. The weight-average molecular weight of the obtained macromonomer A-1 was 6,000.

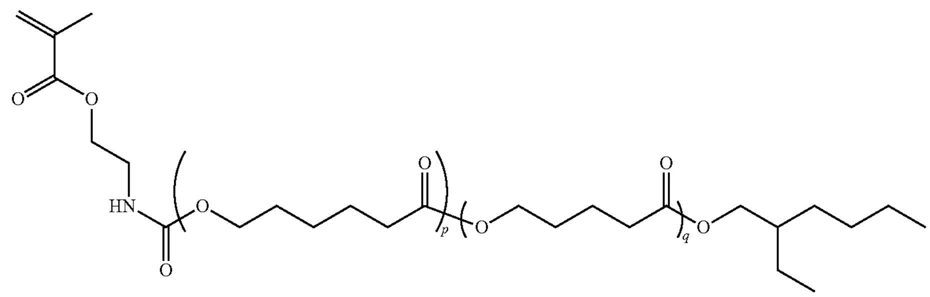

120 g of the above-described macromonomer A-1 solution, 280 g of the above-described monomer solution 1, and 266.7 g of PGMEA were added to a three-neck flask, and a mixture was obtained. The above-described mixture was stirred while blowing nitrogen. Next, the mixture was heated up to 75° C. while causing nitrogen to flow into the flask. Next, 1.65 g of dodecylmercaptan and 0.83 g of 2,2'-azobis (2-methylpropionate) (hereinafter, also referred to as "V-601") were added to the mixture, and the polymerization reaction was started. After heating the mixture at 75° C. for 2 hours, 0.83 g of V-601 was further added to the mixture. After 2 hours, 0.83 g of V-601 was further added to the mixture. After the reaction for 2 hours, the mixture was further added to 90° C. and stirred for 3 hours. Through the above-described operation, the polymerization reaction was completed.

After the completion of the reaction, 6.0 g of dimethyldodecylamine and 2.46 g of TEMPO were added in air, and 15.7 g of glycidyl methacrylate was added. After continuing the reaction at 90° C. for 24 hours in air, completion of the reaction was verified by measuring an acid value. After cooling the mixture up to 60° C., 15.6 g of 2-isocyanatoethyl acrylate (AOI) was further added to the obtained mixture, and the components were caused to react with each other at 60° C. for 6 hours. Disappearance of AOI was verified by $^{1}$H-NMR. By an appropriate amount of PGMEA to the obtained mixture, a 20 mass % solution of the dispersant C-5 was obtained. In the obtained resin C-5, the weight-average molecular weight was 25000, the acid value was 80 mgKOH/mg, and the C═C value was 0.9 mmol/g. In addition, in a case where the amount of toluene included in the resin C-5 was measured, it was verified that the amount of toluene was 5 mass ppm or lower.

Test Example 1

<Manufacturing of Pigment Dispersion Liquid>

Raw materials shown in the Table 2 below were mixed with each other, 230 parts by mass of zirconia beads having a diameter of 0.3 mm were further added to the mixture, and the solution was dispersed using a paint shaker for 5 hours. Next, the beads were separated by filtration. As a result, a pigment dispersion liquid was manufactured. Numerical values in the following table are represented by "part(s) by mass".

TABLE 2

| | Coloring Material | | Dispersing Auxiliary Agent (Pigment Derivative, Resin) | | Dispersant | | Solvent | |
|---|---|---|---|---|---|---|---|---|
| | Kind | Part(s) by Mass | Kind | Part(s) by Mass | Kind | Part(s) by Mass | Kind | Part(s) by Mass |
| Pigment Dispersion Liquid R-1 | PR254 | 12.00 | | | C1 | 4.2 | J1 | 83.80 |
| Pigment Dispersion Liquid R-2 | PR254<br>PY139 | 8.3<br>3.7 | B1 | 2.30 | C5 | 22 | J1 | 63.70 |
| Pigment Dispersion Liquid R-3 | PR264 | 12.00 | | | C1 | 4.2 | J1 | 83.80 |
| Pigment Dispersion Liquid Y-1 | PY139 | 11.00 | B1 | 1.59 | C2 | 4.4 | J1 | 83.01 |
| Pigment Dispersion Liquid Y-2 | Metal Azo Pigment 1 | 11.00 | B1 | 1.59 | C2 | 4.4 | J1 | 83.01 |
| Pigment Dispersion Liquid V-1 | PV23 | 14.20 | P1 | 2.00 | C2 | 3.8 | J1<br>J2 | 70.00<br>10.00 |
| Pigment Dispersion Liquid B-1 | PB16 | 12.59 | | | C2 | 4.4 | J1 | 83.01 |
| Pigment Dispersion Liquid B-2 | PB16<br>PV23 | 10.00<br>2.59 | | | C5 | 22 | J1 | 65.41 |
| Pigment Dispersion Liquid Bk-1 | IB | 12.59 | | | C1 | 4.4 | J1 | 83.01 |
| Pigment Dispersion Liquid Bk-2 | PBk 32 | 12.00 | B1 | 1.2 | C6 | 11 | J1 | 75.8 |

<Preparation of Composition>

Raw materials shown in the following Table 3 were mixed with each other to prepare each of compositions according to Examples 1 to 8 and Comparative Examples 1 and 2. Numerical values in the following table are represented by "part(s) by mass".

TABLE 3

| | | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|---|
| Pigment Dispersion Liquid | R-1 | 24.10 | 44.00 | | | 16.90 | 16.20 | 20.40 | 24.10 | | |
| | R-2 | | | 31.10 | 36.00 | | | | | 30.00 | |
| | R-3 | | | | | | | 8.00 | | | |
| | Y-1 | 12.50 | | | | 2.46 | 2.42 | | 12.50 | | 34.00 |
| | Y-2 | | | | | | | 10.50 | | | |
| | V-1 | 15.99 | | | | | | 10.16 | 15.99 | 10.00 | 13.00 |
| | B-1 | 29.50 | 26.00 | 27.50 | | | | 33.30 | 29.50 | | 34.00 |
| | B-2 | | | | 34.00 | 29.50 | 29.50 | | | | |
| | Bk-1 | | | 12.50 | | | 37.10 | | | 32.80 | |
| | Bk-2 | | | 12.50 | | | | | | | |
| Coloring Material | K1 | | | | | 3.67 | | | | | |
| Polymerizable Monomer | D1 | 2.75 | 1.20 | 0.84 | 3.00 | 3.00 | 3.00 | 2.60 | 2.75 | 2.00 | 2.00 |
| | D2 | | 1.35 | | | | | | | 1.00 | |
| | D3 | | | 1.16 | | 0.56 | 0.56 | | | | 1.00 |
| | D4 | | | 1.00 | | | | 1.00 | | | |
| Silane Coupling Agent | H1 | | | 0.53 | | | | | | | |
| Photopolymerization Initiator | I1 | | 0.480 | 0.476 | | | | 0.940 | | 0.2 | |
| | I2 | | 0.293 | | | 0.344 | 0.344 | | | 0.4 | |
| | I3 | 0.340 | | 0.400 | 0.600 | | | | | | 0.400 |
| | I4 | 0.400 | | | | 0.340 | 0.340 | | 0.300 | | 0.220 |
| | I5 | | | | | | | | | | |
| | I6 | 0.200 | | | | | | | | | |
| | I7 | | | | | | | | 0.200 | | |
| | I8 | | | | | | | | 0.240 | 0.1 | |
| Resin | P1 | | 1.2 | 0.9 | | 1.2 | 1.2 | 0.8 | | | |
| | P2 | 1.8 | | | | | | | 1.8 | | |
| | P3 | | | | 1.5 | 3.62 | | | | 1.5 | |
| | P4 | | | | | | | 0.2 | | 1 | 3.00 |
| Ultraviolet Absorber | L1 | | | | 0.1 | | | | | | |
| Polyfunctional Thiol | M1 | | | | | | | | 0.2 | | |
| Surfactant | F1 | 0.04 | 0.04 | 0.04 | 0.04 | 0.04 | 0.04 | 0.04 | 0.04 | 0.04 | 0.04 |
| Epoxy compound | N1 | | | 0.84 | | | | | | | |
| Polymerization Inhibitor | G1 | 0.0013 | 0.0011 | 0.0013 | 0.0009 | 0.001 | 0.001 | 0.0013 | 0.0013 | 0.0013 | 0.001 |
| Solvent | J1 | 12.34 | 25.41 | 10.23 | 24.76 | 19.25 | 9.25 | 10.02 | 12.34 | 20.93 | 10.22 |
| | J2 | | | | | 19.10 | | 2.00 | | | 2.10 |

The raw materials shown above in the table are as follows.

(Coloring Material)

Metal azo pigment 1: the above-described metal azo pigment 1

PR254: C.I. Pigment Red 254 (red colorant)

PR264: C.I. Pigment Red 264 (red colorant)

PY139: C.I. Pigment Yellow 139 (yellow colorant)

PV23: C.I. Pigment Violet 23 (violet colorant)

PB16: C.I. Pigment Blue 16 (metal-free phthalocyanine compound)

IB: Irgaphor Black (manufactured by BASF SE, black colorant)

PBk 32: C.I. Pigment Black 32 (black colorant)

K1: a compound having the following structure (black colorant)

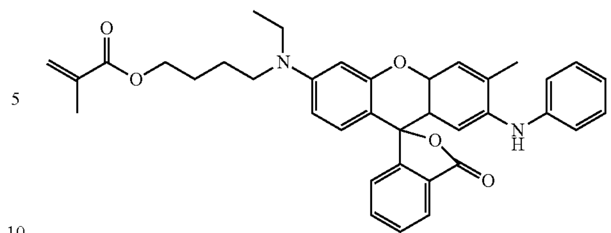

(Pigment Derivative)

B1: a compound having the following structure (B1)

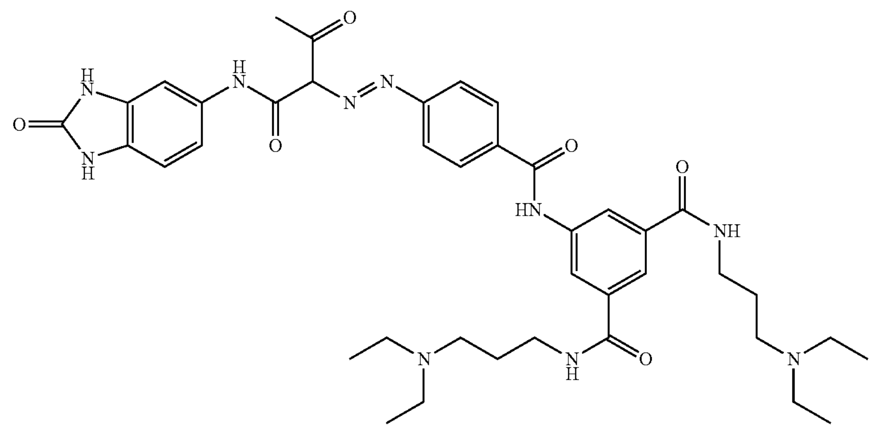

(Dispersant)

C1: a resin having the following structure (a numerical value added to a main chain represents a molar ratio, and a numerical value added to a side chain represents the number of repeating units; Mw=20,000)

C2: a resin having the following structure (a numerical value added to a main chain represents a molar ratio, and a numerical value added to a side chain represents the number of repeating units; Mw=24,000)

C5: the dispersant C5 manufactured in Manufacturing Example 2 described above (concentration of solid contents: 20 mass %)

C6: a copolymer described in Example 1 of WO2012/001945A (concentration of solid contents: 20 mass %)

(C1)

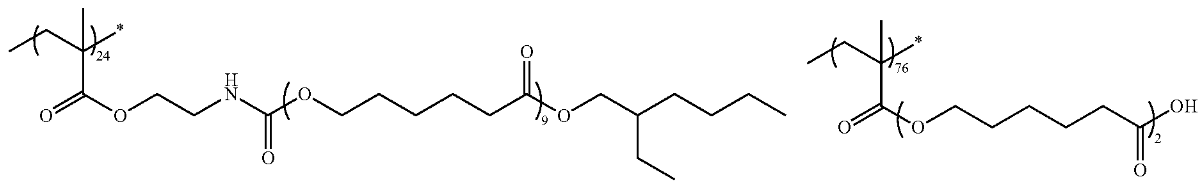

-continued (C2)

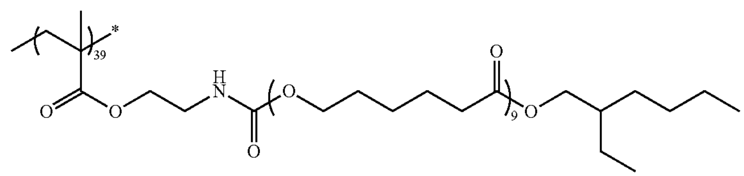
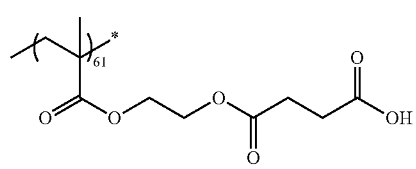

(Resin)

P1: a resin having the following structure (Mw=11000; a numerical value added to a main chain represents a molar ratio; Me represents a methyl group)

P2: a resin having the following structure (Mw=4400, acid value=95 mgKOH/g; in the following structural formula, M represents a phenyl group, and A represents a biphenyltetracarboxylic dianhydride residue)

P3: CYCLOMER ACA250 (concentration of solid contents: 45 mass %, manufactured by Daicel Corporation)

P4: a resin having the following structure (Mw=30000; a numerical value added to a main chain represents a molar ratio)

(P1)

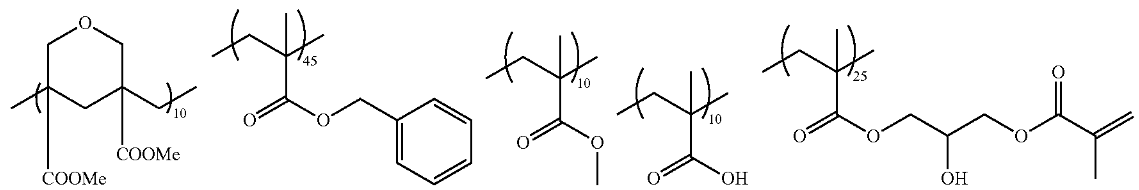

(P2)

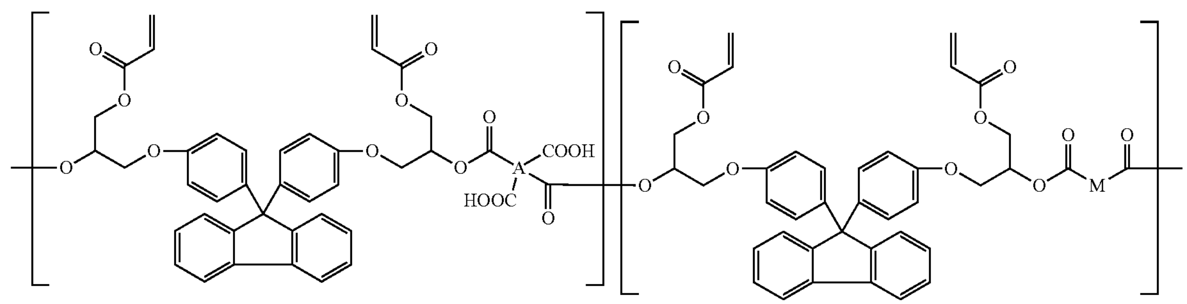

(P4)

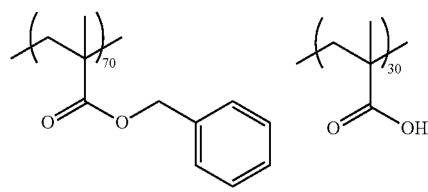

(Polymerizable Monomer)

D1: TMPEOTA (manufactured by Daicel-Allnex Ltd.)

D2: a compound having the following structure

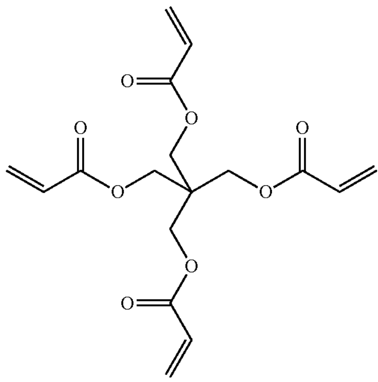 [SMILES: C=CC(=O)OCC(COC(=O)C=C)(COC(=O)C=C)COC(=O)C=C]

D3: a polymerizable monomer D3 manufactured in Manufacturing Example 1 (concentration of solid contents: 50 mass %)

D4: ARONIX M-520 (manufactured by Toagosei Co., Ltd.)

(Silane Coupling Agent)

H1: a compound having the following structure (in the following structural formulae, Et represents an ethyl group)

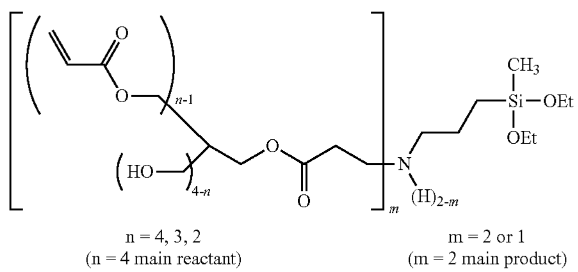

(Photopolymerization Initiator)

I1 to I4: compounds (oxime compounds) having the following structures (I1)

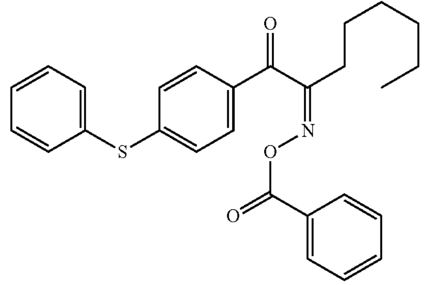

-continued (I2)

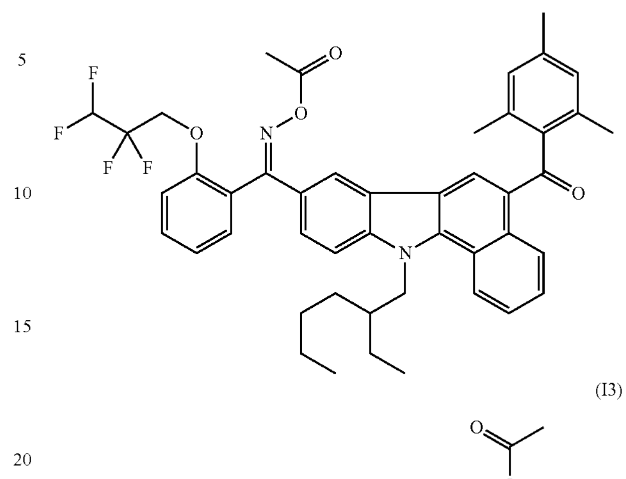

(I3)

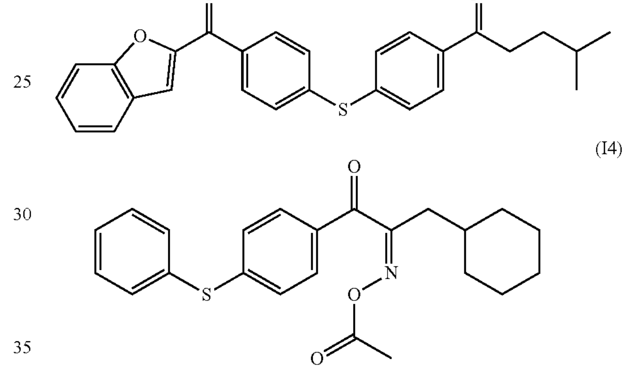

(I4)

I5: ADEKA ARKLS NCI-831 (manufactured by Adeka Corporation, an oxime compound)

I6: a compound No. 12 described in paragraph "0007" of JP2017-523465A

I7: a compound represented by Formula (2) described in paragraph "0025" of JP2017-151342A I8: a compound 6 described in paragraph "0031" of JP2017-167399A (Ultraviolet Absorber)

L1: a compound having the following structure

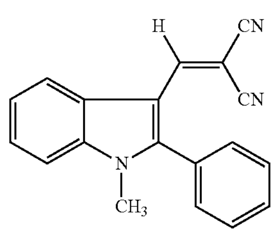 [SMILES: Cn1c(-c2ccccc2)c(C=C(C#N)C#N)c2ccccc21]

(Polyfunctional Thiol)

M1: trimethylolpropane tris(3-mercaptobutyrate)

(Surfactant)

F1: the following mixture (Mw=14000, in the following formula, "%" representing the proportion of a repeating unit is mol %)

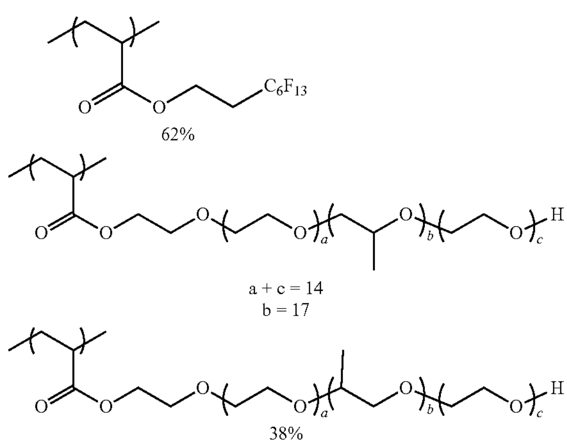

(Epoxy Compound)

N1: EHPE 3150 (manufactured by Daicel Corporation)

(Polymerization Inhibitor)

G1: p-methoxyphenol (Solvent)

J1: propylene glycol monomethyl ether acetate (PGMEA)

J2: cyclohexanone

<Evaluation of Spectral Characteristics>

Each of the compositions was applied to a glass substrate using a spin coater at a rotation speed adjusted such that the thickness of the post-baked film was as shown in the following table, and was pre-baked using a hot plate at 100° C. for 120 seconds. Next, the entire surface of the pre-baked coating film was irradiated and exposed to i-rays at an exposure dose of 1000 mJ/cm², and was post-baked using a hot plate at 220° C. for 5 minutes to form a film.

Using a spectrophotometer (U-4100, manufactured by Hitachi High-Technologies Corporation), absorbances and transmittances of the obtained film in a wavelength range of 400 to 1100 nm to measure an absorbance A at a wavelength of 700 nm, a transmittance TA at a wavelength of 700 nm, an absorbance B at a wavelength of 810 nm, a transmittance TB at a wavelength of 810 nm, a minimum value C of an absorbance in a wavelength range of 400 to 700 nm, a maximum value TC of a transmittance in a wavelength range of 400 to 700 nm, a maximum value D of an absorbance in a wavelength range of 810 to 1100 nm, a minimum value TD of a transmittance in a wavelength range of 810 to 1100 nm, a ratio A/B of the absorbance A at a wavelength of 700 nm to the absorbance B at a wavelength of 810 nm, and a ratio C/D of the minimum value C of the absorbance in a wavelength range of 400 to 700 nm to the maximum value D of the absorbance of the composition in a wavelength range of 810 to 1100 nm.

Evaluation of Light Fastness>

Each of the compositions was applied to soda glass (75 mm×75 mm, thickness: 1.1 mm) using a spin coater at a rotation speed adjusted such that the thickness of the post-baked film was 1.1 and was pre-baked using a hot plate at 100° C. for 120 seconds. Next, the entire surface of the pre-baked coating film was exposed using an extra high pressure mercury lamp ("USH-500BY" (trade name), manufactured by Ushio Inc.) at an exposure dose of 1000 mJ/cm². Next, the exposed coating film was post-baked using a hot plate in an air atmosphere at 220° C. for 5 minutes to form a film. Regarding the obtained film, a transmittance in a wavelength range of 400 nm to 700 nm was measured using "MCPD-3000" (trade name, manufactured by Otsuka Electronics Co., Ltd.).

Next, an ultraviolet cut filter (manufactured by AS ONE Corporation, KU-1000100 [trade name]) was mounted on the film, and a light fastness test was performed using a light fastness tester (manufactured by Suga Test Instruments Co., Ltd., Xenon Weather Meter SX75 [trade name]) by irradiating the film with light at 100000 lux for 100 hours (10000000 lux in total). The temperature internal temperature of the tester) of the film in the light fastness test was set to 63° C. The relative humidity in the tester was set to 50%. After the light fastness test, the amount of change in the transmittance of the film was measured to evaluate light fastness. The amount of change in transmittance for comparison was the amount of change (Transmittance before Light Fastness Test-Transmittance after Light Fastness Test) regarding a wavelength at which the amount of change in transmittance was the highest in a wavelength range of 400 nm to 700 nm. A small numerical value of the amount of change in transmittance represents excellent light fastness.

3: the above-described amount of change was 3% or lower

2: the above-described amount of change was higher than 3% and 6% or lower

1: the above-described amount of change was higher than 6%

TABLE 4

| | | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|---|
| Film Thickness (μm) | | 1.1 | 1.1 | 1.1 | 1.1 | 1.1 | 1.1 | 1.1 | 1.1 | 1.1 | 1.1 |
| Transmittance (%) | TA: 700 nm | 2.02 | 1.83 | 1.99 | 1.89 | 3.21 | 3.28 | 1.49 | 2.02 | 63.84 | 1.59 |
| | TB: 810 nm | 89.74 | 89.56 | 88.57 | 89.82 | 85.19 | 86.12 | 89.99 | 89.74 | 88.42 | 91.17 |
| | TC: 400-700 nm | 3.45 | 7.59 | 3.61 | 2.31 | 5.13 | 5.47 | 6.48 | 3.45 | 63.84 | 13.03 |
| | TD: 810-1100 nm | 89.74 | 89.56 | 88.57 | 89.82 | 86.12 | 86.12 | 89.99 | 89.74 | 88.42 | 91.17 |
| Absorbance | A: 700 nm | 1.69 | 1.74 | 1.70 | 1.72 | 1.49 | 1.48 | 1.83 | 1.69 | 0.19 | 1.80 |
| | B: 810 nm | 0.0470 | 0.0479 | 0.0527 | 0.0466 | 0.0696 | 0.0649 | 0.0458 | 0.0470 | 0.0535 | 0.0402 |
| | C: 400-700 nm | 1.46 | 1.12 | 1.44 | 1.64 | 1.29 | 1.26 | 1.19 | 1.46 | 0.19 | 0.89 |
| | D: 810-1100 nm | 0.0470 | 0.0479 | 0.0527 | 0.0466 | 0.0649 | 0.0649 | 0.0458 | 0.0470 | 0.0535 | 0.0402 |
| Absorbance Ratio | A/B | 36.1 | 36.3 | 32.3 | 37.0 | 21.5 | 22.9 | 39.9 | 36.1 | 3.6 | 44.8 |
| | C/D | 31.1 | 23.4 | 27.4 | 35.1 | 19.9 | 19.4 | 25.9 | 31.1 | 3.6 | 22.0 |
| Light Fastness | | 3 | 3 | 3 | 3 | 3 | 3 | 3 | 3 | 2 | 1 |

As shown in the above-described table, in the film obtained using the composition according to Example, light fastness was higher than that of the film obtained using the composition according to Comparative Example.

Test Example 2

Example 101

A silicon wafer having a size of 8 inch (20.32 cm) was used as a support. CT-4000L (manufactured by Fujifilm Electronic Materials Co., Ltd.) was uniformly applied to the support by spin coating to form a coating film. The formed coating film was further heated in an oven at 220° C. for 1 hour to cure the coating film. As a result, an undercoat layer was formed. The rotation speed during the spin coating was adjusted such that the thickness of the heated coating film was about 0.1 μm.

Next, the composition according to Example 1 was applied to the undercoat layer of the support using a spin coater such that the thickness of the post-baked film was 1.1 and was dried using a hot plate at 100° C. for 120 seconds.

Next, using an i-ray stepper exposure device FPA-i5+ (manufactured by Canon Corporation), the coating film was exposed to light having a wavelength of 365 nm at an exposure dose of 1000 mJ/cm$^2$ through a 100 μm×100 μm island pattern mask. After the exposure, the exposed film was developed using an alkali developer (CD-2000, manufactured by Fujifilm Electronic Materials Co., Ltd.) at 25° C. for 40 seconds. Next, the developed film was rinsed with flowing water for 30 seconds was dried by spraying, and then was baked using a hot plate at 220° C. for 5 minutes. As a result, an infrared transmitting filter was formed. A band pass filter was formed on a surface of the obtained infrared transmitting filter using the following method, and a laminate including the infrared transmitting filter and the band pass filter was manufactured. This laminate was incorporated into a solid-state imaging element using a well-known method. The obtained solid-state imaging element was irradiated with light emitted from an infrared light emitting diode (infrared LED) as a light source in a low-illuminance environment (0.001 Lux) to acquire images. Next, the imaging performance of the solid-state imaging element was evaluated. The subject was able to be clearly recognized on the image.

The band pass filter was manufactured as follows.

At a vapor deposition temperature of 100° C., a silica ($SiO_2$) layer and a titania ($TiO_2$) layer were alternately laminated to obtain a band pass filter.

In this band pass filter, a maximum value of a transmittance in a wavelength range of 730 to 780 nm was 10% or lower, and a minimum value of a transmittance in a wavelength range of 840 to 860 nm was 70% or higher. In addition, in a wavelength range of 700 to 850 nm, a wavelength λ1 at which a transmittance of the infrared transmitting filter was 50% was shorter than a shortest wavelength λ2 at which a transmittance of the band pass filter was 50%, and a difference between the wavelength λ2 and the wavelength λ1 was 30 nm or longer.

EXPLANATION OF REFERENCES

110: imaging region
111: near infrared cut filter
112: color filter
114: infrared transmitting filter
115: microlens
116: planarizing layer

What is claimed is:

1. A composition comprising:

a metal-free phthalocyanine compound;

a red colorant; and a solvent, wherein a ratio A/B of an absorbance A at a wavelength of 700 nm to an absorbance B at a wavelength of 810 nm is 10 or higher, and wherein a content of the red colorant is 70 to 150 parts by mass with respect to 100 parts by mass of the metal-free phthalocyanine compound.

2. The composition according to claim 1, wherein the metal-free phthalocyanine compound is a blue colorant.

3. The composition according to claim 1, wherein the metal-free phthalocyanine compound is Color Index Pigment Blue 16.

4. The composition according to claim 1, further comprising at least one selected from a yellow colorant or a violet colorant.

5. The composition according to claim 1, wherein a ratio C/D of a minimum value C of an absorbance of the composition in a wavelength range of 400 to 700 nm to a maximum value D of an absorbance of the composition in a wavelength range of 810 to 1100 nm is 4.5 or higher.

6. The composition according to claim 1, further comprising a black colorant, wherein the black colorant includes a bisbenzofuranone compound.

7. The composition according to claim 1, which is a composition for an infrared transmitting filter.

8. A film which is formed using the composition according to claim 1.

9. An infrared transmitting filter comprising:

the film according to claim 8.

10. A solid-state imaging element comprising the infrared transmitting filter according to claim 9.

11. The solid-state imaging element according to claim 10, further comprising a band pass filter that is provided on an optical path of the infrared transmitting filter and allows transmission of at least a part of infrared light transmitted through the infrared transmitting filter.

12. The solid-state imaging element according to claim 11, wherein the band pass filter is a filter that allows transmission of visible light and transmission of at least a part of infrared light transmitted through the infrared transmitting filter.

13. The solid-state imaging element according to claim 11, wherein in the band pass filter, a maximum value of a transmittance in a wavelength range of 730 to 780 nm is 10% or lower, and a minimum value of a transmittance in a wavelength range of 840 to 860 nm is 70% or higher.

14. The solid-state imaging element according to claim 11, wherein in a wavelength range of 700 to 850 nm, a wavelength λ1 at which a transmittance of the infrared transmitting filter is 50% is shorter than a shortest wavelength λ2 at which a transmittance of the band pass filter is 50%, and a difference between the wavelength λ2 and the wavelength λ1 is 30 nm or longer.

15. The composition according to claim 1, wherein the red colorant is a diketo pyrrolo pyrrole compound.

* * * * *